(12) United States Patent
Ambrosi et al.

(10) Patent No.: US 11,955,173 B2
(45) Date of Patent: Apr. 9, 2024

(54) FIRST FIRE OPERATION FOR OVONIC THRESHOLD SWITCH SELECTOR

(71) Applicant: Taiwan Semiconductor Manufacturing Company, Ltd., Hsinchu (TW)

(72) Inventors: Elia Ambrosi, Hsinchu (TW); Cheng-Hsien Wu, Hsinchu (TW); Hengyuan Lee, Hsinchu County (TW); Chien-Min Lee, Hsinchu County (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 137 days.

(21) Appl. No.: 17/826,180

(22) Filed: May 27, 2022

(65) Prior Publication Data

US 2023/0386573 A1    Nov. 30, 2023

(51) Int. Cl.
*G11C 13/00* (2006.01)

(52) U.S. Cl.
CPC ........ *G11C 13/003* (2013.01); *G11C 2213/72* (2013.01)

(58) Field of Classification Search
CPC .......................... G11C 13/003; G11C 2213/72
USPC ................................................... 365/148, 158
See application file for complete search history.

(56) References Cited

U.S. PATENT DOCUMENTS

| 2012/0243306 A1* | 9/2012 | Karpov | G11C 13/0064 365/163 |
| 2021/0090652 A1* | 3/2021 | Arendt | G11C 13/0038 |
| 2022/0139454 A1* | 5/2022 | Robertson | G11C 13/004 365/148 |
| 2022/0157376 A1* | 5/2022 | Franklin | G11C 11/1659 |
| 2022/0209105 A1* | 6/2022 | Brew | H10N 70/823 |

(Continued)

FOREIGN PATENT DOCUMENTS

CN        114596894 A  *  6/2022  ......... G11C 13/0002

OTHER PUBLICATIONS

Sangmin Lee et al., "Understanding of forming and switching mechanism using trap distribution model for ovonic threshold switch device", American Institute of Physics, Appl. Phys. Lett. 118, 212103 (2021), May 25, 2021, pp. 1-6.

(Continued)

*Primary Examiner* — Michael T Tran
(74) *Attorney, Agent, or Firm* — JCIPRNET

(57) ABSTRACT

First fire operations for an ovonic threshold switch (OTS) selector is provided. A first fire operation includes setting a peak amplitude of a voltage pulse, and performing at least one cycle, including: providing the voltage pulse to the OTS selector; sensing an output current passing through the OTS selector in response to the received voltage pulse; comparing a peak amplitude of the voltage pulse with a maximum peak amplitude ensuring initialization of the OTS selector; ending the first fire operation if the peak amplitude reaches the maximum peak amplitude; comparing the output current with a target current indicative of initialization of the OTS selector if the peak amplitude is lower than the maximum peak amplitude; ending the first fire operation if the output current reaches the target current; and setting another voltage pulse with a greater peak amplitude if the output current is lower than the target current.

20 Claims, 19 Drawing Sheets

(56) References Cited

U.S. PATENT DOCUMENTS

2022/0359007 A1* 11/2022 Jo .................... G11C 13/0028
2022/0366211 A1* 11/2022 Ma .................... G06F 3/0679
2023/0064007 A1* 3/2023 Mousavi Iraei ... G11C 13/0026
2023/0091314 A1* 3/2023 Wang .................... G11C 16/26
                                                                    365/189.011

OTHER PUBLICATIONS

A. Verdy et al., "Optimized Reading Window for Crossbar Arrays Thanks to Ge—Se—Sb—N-based OTS Selectors", 2018 IEEE International Electron Devices Meeting, Dec. 1-5, 2018, pp. 1-4.

* cited by examiner

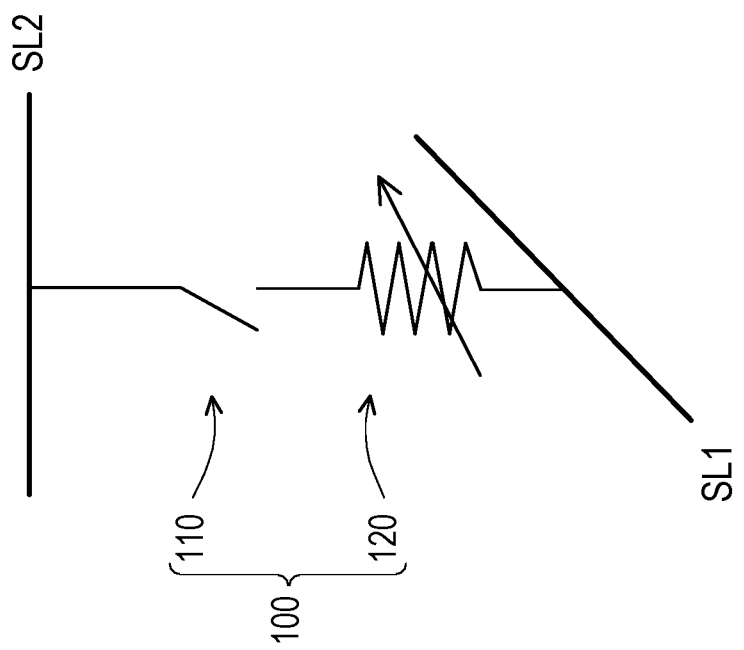

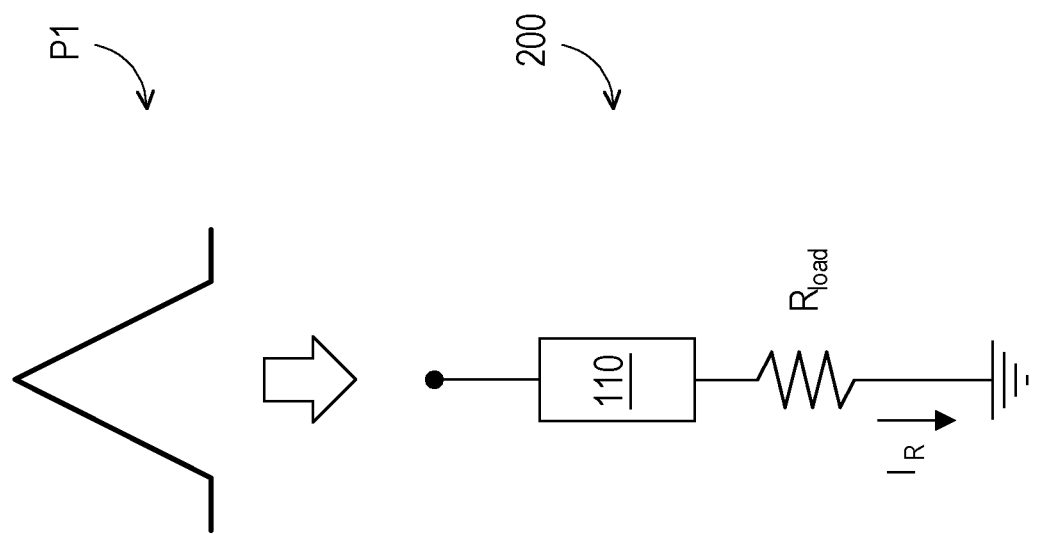

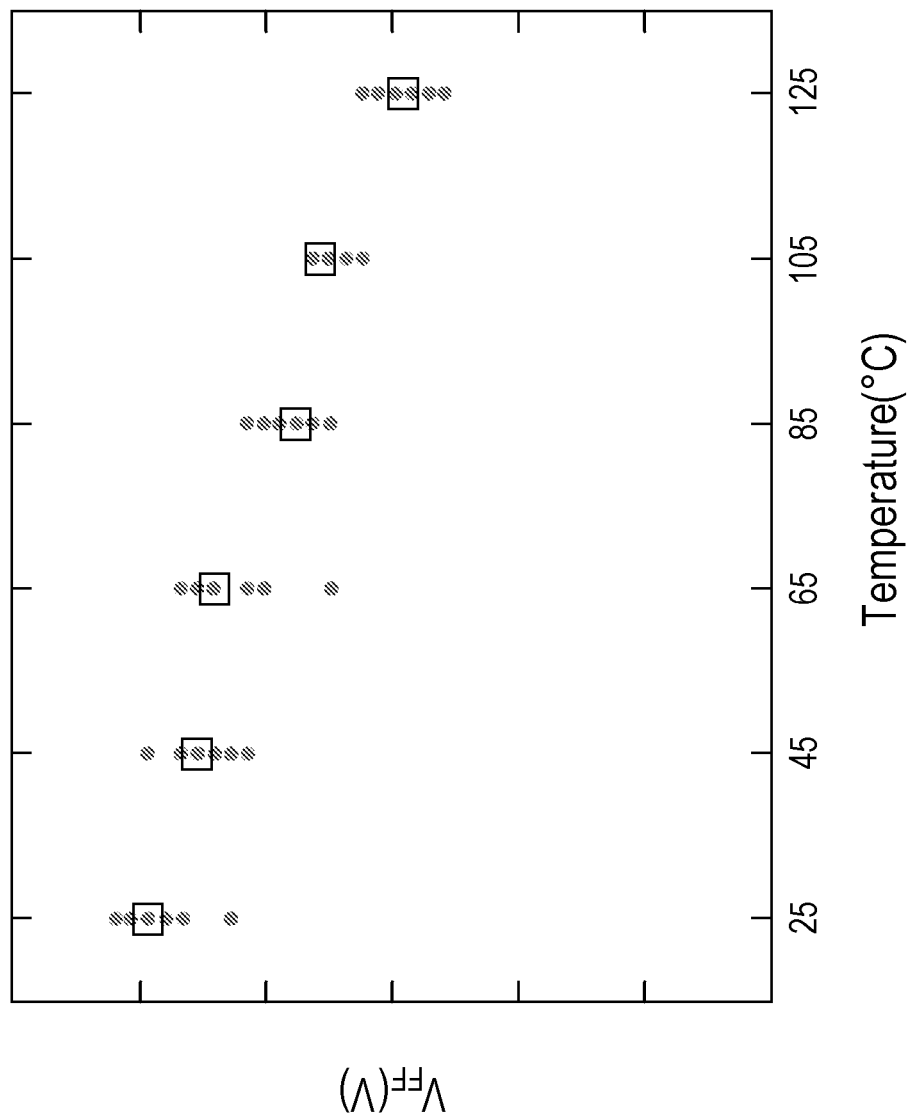

FIRST FIRE OPERATION FOR OVONIC THRESHOLD SWITCH SELECTOR

BACKGROUND

With advances in digital technology, there is a greater demand for a nonvolatile memory device with higher capacity, less writing power, higher writing/reading speed, and longer service life. In order to meet the demand, refinement of flash memory has been progressed. On the other hand, nonvolatile memory device including memory cells using resistance variable elements for storing digital data has been researched and developed.

Mostly, each of these nonvolatile memories has field effect transistors (FETs) that control connection between the resistance variable elements and a driving circuit. The FETs have high on/off ratio and prevent leakage current from passing through the unselected memory cells. However, since a FET is a three-terminal device, controlling access of the resistance variable elements by the FETs can significantly limit design flexibility and integration level in creating these nonvolatile memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1C is an equivalent circuit of the memory cell as shown in FIG. 1B, according to some embodiments of the present disclosure.

FIG. 2B is a schematic diagram illustrating the first fire operation performed on a test structure.

FIG. 2C is a diagram showing dependency of first fire voltage with respect to process temperature of the first fire operation shown in FIG. 2B.

DETAILED DESCRIPTION

Figure 1A:
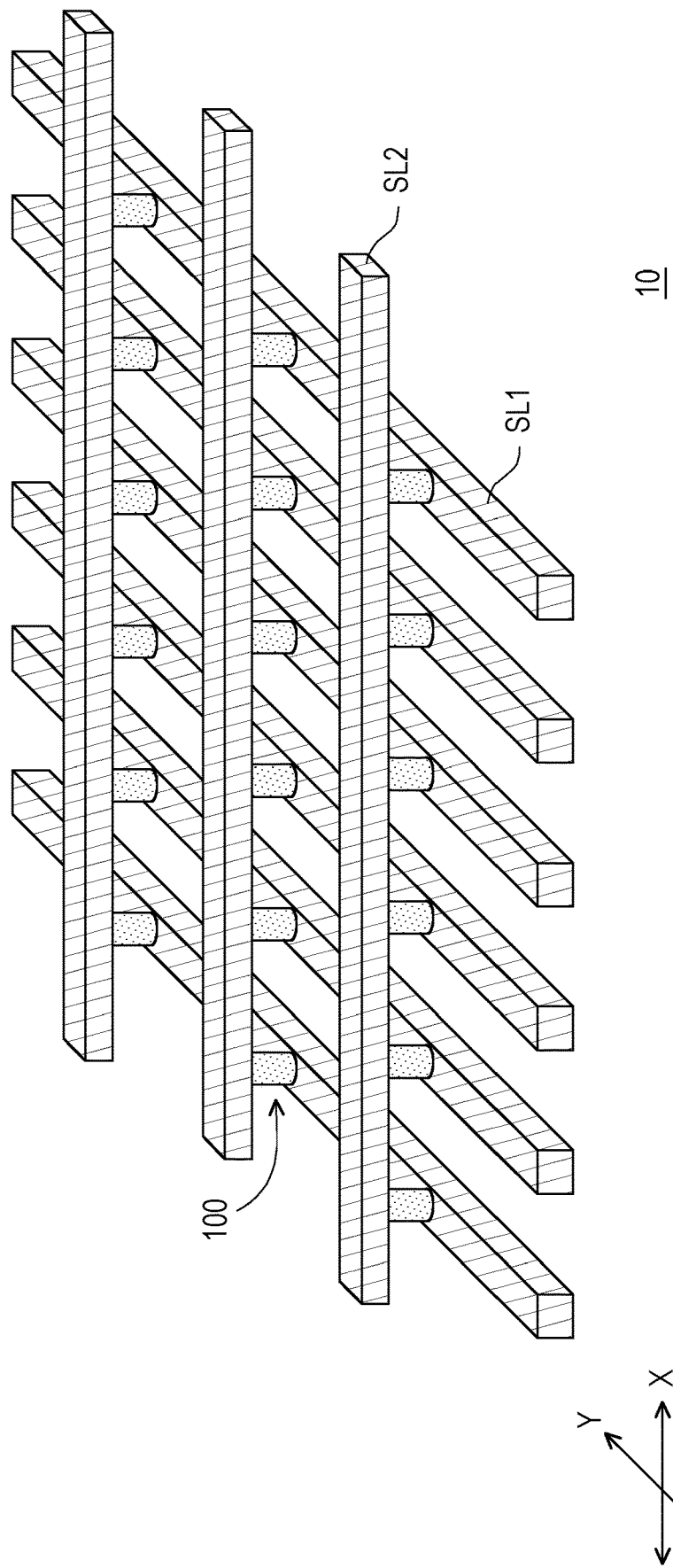
FIG. 1A is a schematic three-dimensional view illustrating a memory array, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic three-dimensional view illustrating a memory array 10, according to some embodiments of the present disclosure.

Referring to FIG. 1A, the memory array 10 includes memory cells 100 arranged along columns and rows. The memory cells 100 in each column are arranged along a direction Y, while the memory cells 100 in each row are arranged along a direction X intersected with the direction Y. The memory cells 100 are defined at intersections of first signal lines SL1 and second signal lines SL2 running over and intersecting with the first signal lines SL1. The first signal lines SL1 may be connected to or functioned as bottom terminals of the memory cells 100, while the second signal lines SL2 may be connected to or functioned as top terminals of the memory cells 100. The first signal lines SL1 may be referred as bit lines, while the second signal lines SL2 may be referred as word lines. Alternatively, the first signal lines SL1 may be referred as word lines, while the second signal lines SL2 may be referred as bit lines. In some embodiments, as shown in FIG. 1A, the first signal lines SL1 extend along the direction Y, while the second signal lines SL2 extend along the direction X. In these embodiments, each first signal line SL1 may connect the bottom terminals of a column of the memory cells 100, or functioned as a common bottom terminal for a column of the memory cells 100. In addition, each second signal line SL2 may connect the top terminals of a row of the memory cells 100, or functioned as a common top terminal for a row of the memory cells 100. However, the extending directions of the first and second signal lines SL1, SL2 may be swapped or altered, as long as the memory cells 100 are formed at intersections of the first and second signal lines SL1, SL2.

Figure 1B:
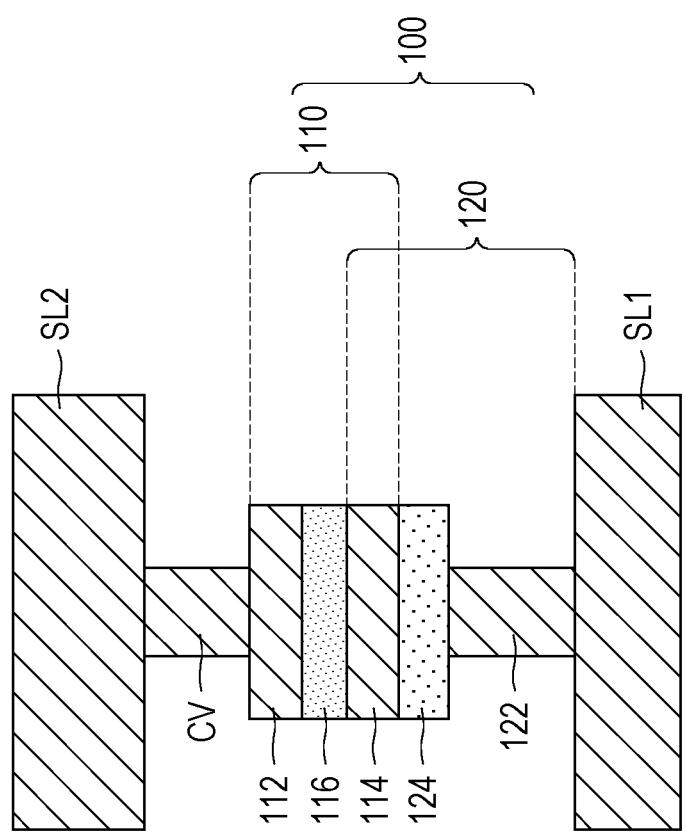
FIG. 1B is a cross-sectional view schematically illustrating a memory cell in the memory array as shown in FIG. 1A, according to some embodiments of the present disclosure.

FIG. 1B is a cross-sectional view schematically illustrating a memory cell 100 in the memory array 10, according to some embodiments of the present disclosure.

Referring to FIG. 1A and FIG. 1B, each memory cell 100 may include a selector 110 and a resistance variable storage element 120. The selector 110 is a two-terminal switching device, and one of the terminals of the selector 110 is shared with the resistance variable storage element 120. In some embodiments, an electrode 112 is functioned as a top terminal of the selector 110, and may be coupled to the second signal line SL2 through a conductive via CV. In addition, an electrode 114 may be functioned as a bottom terminal of the selector 110, and may be shared with the resistance variable storage element 120. The electrodes 112, 114 are each formed of a conductive material. As examples, candidates of the conductive material may include Cu, W, TiN, TaN, Ru, AlN, Co, C, the like and combinations thereof.

A switching layer 116 may be sandwiched between the electrodes 112, 114. An electrical resistance across the switching layer 116 may be altered during operation of the selector 110. When the switching layer 116 is in a low resistance state, the selector 110 is in an on state, and a conduction path can be established through the selector 110. On the other hand, when the switching layer 116 is in a high resistance state, the selector 110 is in an off state. As the selector 110 is off, only a very limited current could pass through the selector 110. In some embodiments, the selector 110 is an ovonic threshold switch (OTS) selector. In these embodiments, the selector 110 can be turned on when a voltage bias applied across the switching layer 116 reaches a threshold voltage. On the other hand, when the voltage bias does not reach the threshold voltage or falls below a holding voltage, the conductive path may be cut off, which result in a high resistance state of the switching layer 116 (i.e., an off state of the selector 110). According to some embodiments, the switching layer 116 is formed of a chalcogenide compound. Candidates of the chalcogenide compound may contain combinations of elements including Te, Se, As, S, Sb or the like. For instance, the switching layer 116 may include GeTe, GeCTe, AsGeSe, GeSbTe, GeSiAsTe, GeSe, GeSbSe, GeSiAsSe, GeS, GeSbS, GeSiAsS, the like, or combinations thereof.

The resistance variable storage element 120 may be a two-terminal device as well. As described above, the electrode 114 may be functioned as a common terminal of the selector 110 and the resistance variable storage element 120. In some embodiments, an electrode 122 is functioned as the other terminal of the resistance variable storage element 120, and may be coupled to the first signal line SL1. As similar to the electrodes 112, 114, the electrode 122 is formed of a conductive material as well. As examples, candidates of the conductive material may include Cu, W, TiN, TaN, Ru, AlN, Co, C, the like and combinations thereof.

A storage layer 124 lies between the two terminals of the resistance variable storage element 120 (e.g., the electrodes 114, 122). Microstructure in the storage layer 124 may be altered according to input signals applied across the storage layer 124. In corresponding to the microstructure change, the storage layer 124 may be switched between a high resistance state and a low resistance state. Further, the microstructure and thus the resistance state of the storage layer 124 may be held even when the input signal is removed. Accordingly, the resistance variable storage element 120 is a non-volatile memory device. In some embodiments, the memory array 10 including a plurality of the memory cells 100 is a phase change random access memory (PCRAM). In these embodiments, a crystallinity of the storage layer 124 in the resistance variable storage element 120 of each memory cell 100 may be increased when the storage layer 124 is switched to the low resistance state. On the other hand, when the storage layer 124 is in the high resistance state, the storage layer 124 may be amorphous or may have a rather low crystallinity. In these embodiments where the memory array 10 is a PCRAM, the storage layer 124 in each memory cell 100 of the memory array 10 may be formed of a chalcogenide compound. The chalcogenide compound may include Ge, Te and Sb. For instance, the chalcogenide material may be GeSbTe, such as $Ge_2Sb_2Te_5$ (GST225), $Ge_4Sb_2Te_4$ (GST424), $Ge_4Sb_6Te_7$ (GST467) or so forth. As other examples, the chalcogenide may include $Ti_{0.4}Sb_2Te_3$, super lattice $Sb_2Te_3/TiTe_2$, super lattice $GeTe/Sb_2Te_3$, super lattice $Ti_2Te/Sb_2Te_3$ or so forth.

In alternative embodiments, the memory array 10 is a resistive random access memory (RRAM). In these alternative embodiments, when the storage layer 124 in each memory cell 100 of the memory array is at the low resistance, a conductive filament may be formed through the storage layer 124. On the other hand, such conductive filament may be cut off when the storage layer 124 is switched to the high resistance state. In these embodiments where the memory array is a RRAM, the storage layer 124 in each memory cell 100 of the memory array 10 may be a dielectric layer, such as a high-k dielectric layer. For instance, the dielectric layer may include nickel oxide, titanium oxide, hafnium oxide, zirconium oxide, zinc oxide, tungsten oxide, aluminum oxide, tantalum oxide, molybdenum oxide, copper oxide or so forth.

In other embodiments, the memory array 10 is a magnetoresistive random access memory (MRAM). In these embodiments, the storage layer 124 in each memory cell 100 of the memory array 10 may be a multilayer structure including an insulating thin layer and magnetic layers lying at opposite sides of the insulating thin layer. The storage layer 124 has a low resistance when alignment of magnetic moments in the magnetic layers is in a parallel configuration. On the other hand, the storage layer 124 has a high resistance when alignment of magnetic moments in the magnetic layers is in an anti-parallel configuration.

Detailed structure of the resistance variable storage element 120 may vary, according to type, design and manufacturing process of the resistance variable storage element 120, the present disclosure is not limited thereto.

FIG. 1C is an equivalent circuit of a memory cell 100, according to some embodiments of the present disclosure.

Referring to FIG. 1B and FIG. 1C, the selector 110 is schematically indicated by a switch in the equivalent circuit of the memory cell 100. Actually, the selector 110 may be bi-directional, and may be alternatively presented by two diodes connected back to back. In addition, the resistance variable storage element 120 is indicated by a variable resistor in the equivalent circuit, since a variable resistor also has an alterable resistance. As shown in FIG. 1C, the selector 110 and the resistance variable storage element 120 are serially connected between a first signal line SL1 and a second signal line SL2, and share a common terminal. Since the selector 110 and the resistance variable storage element 120 are connected in series, a voltage applied across the memory cell 100 is divided across the selector 110 and the resistance variable storage element 120.

During operation of the memory cell 100, a voltage pulse may be provided to one of the corresponding first and second signal lines SL1, SL2, and the other one of these first and second signal lines SL1, SL2 may receive a reference voltage (e.g., a ground voltage). In order to program the resistance variable storage element 120, the voltage pulse must be high enough for ensuring that a voltage across the selector 110 is greater than the threshold voltage of the selector 110, such that the selector 110 can be turned on. Accordingly, the resistance variable storage element 120 is accessible, and can be programmed. On the other hand, in some embodiments, the voltage pulse may be provided with a lower peak voltage during a read operation, such that the selector 110 can be turned on when a low resistance state is stored in the resistance variable storage element 120, and may be in an off state when a high resistance state is stored in the resistance variable storage element 120. In these embodiments, by detecting whether a conductive path is established through the selector 110 and the resistance variable storage element 120, the resistance state stored in the resistance variable storage element 120 can be identified. In alternative embodiments, the selector 110 is turned on even during a read operation for sensing a high resistance state stored in the resistance variable storage element 120.

Figure 1D:
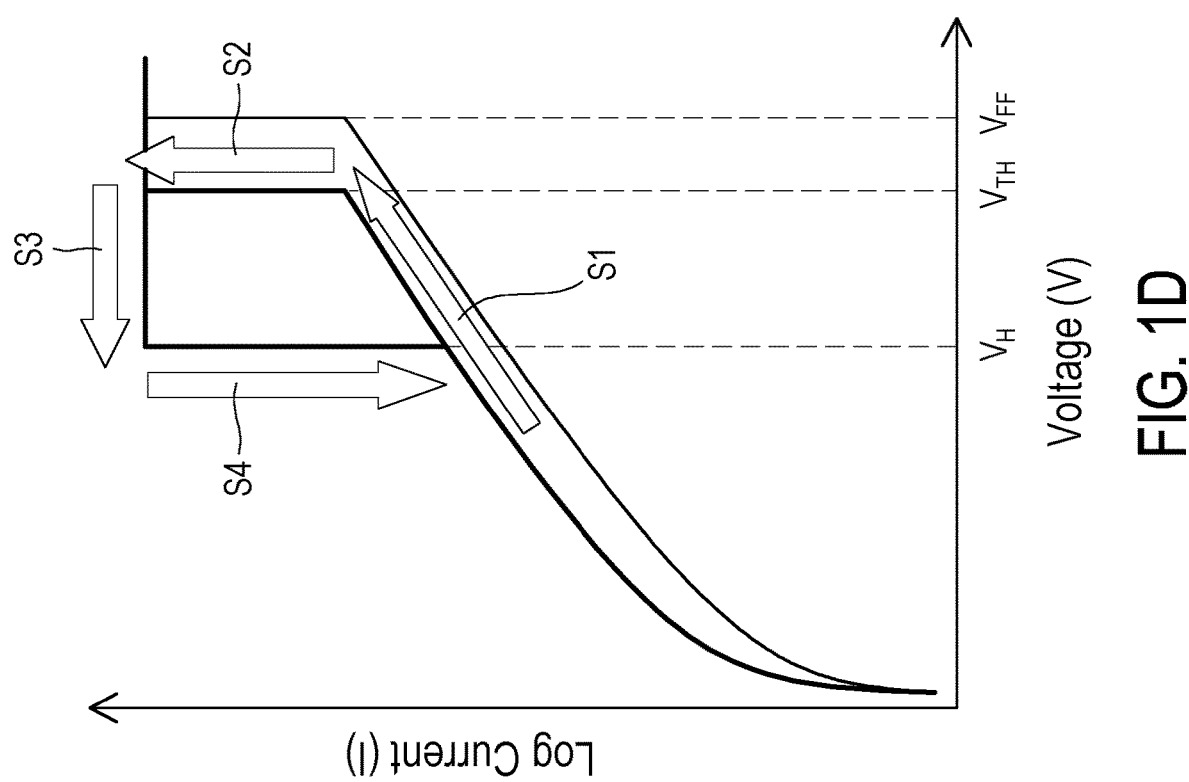
FIG. 1D is a current-voltage (I-V) curve illustrating an operation cycle and an initialization operation of a selector in the memory cell, according to some embodiments of the present disclosure.

FIG. 1D is a current-voltage (I-V) curve illustrating an operation cycle and an initialization operation of a selector 110, according to some embodiments of the present disclosure.

Referring to FIG. 1D, each operation cycle of the selector 110 may have multiple stages. Along a timeline, a voltage applied across the selector 110 may increase during a first stage S1, and then decrease at a third stage S3. At the first stage S1, a current passing through the selector 110 stays low, and the selector 110 is in a high resistance state (i.e., an off state). When the voltage is raised over a threshold voltage $V_{TH}$ of the selector 110, operation of the selector 110 enters a second stage S2. At the second stage S2, current passing through the selector 110 significantly increases as the voltage across the selector 110 is slightly raised or kept at the threshold voltage $V_{TH}$, and the selector 110 is being switched to a low resistance state (i.e., an on state). When the current is saturate, operation of the selector 110 enters the third stage S3, at which the current passing through the selector 110 remains high, and the selector 110 is in the low resistance state (i.e., the on state). A fourth stage S4 is entered as the voltage across the selector 110 is lowered below a holding voltage $V_H$, and current passing through the selector 110 decreases dramatically as the voltage applied across the selector 110 is slightly lowered. At the fourth stage S4, the selector 110 is being switched back to the high resistance state (i.e., the off state), and an operation cycle may be completed.

When the selector 110 is turned on at the third stage S3, the resistance variable storage element 120 coupled to the selector 110 can be programmed, or a read current may pass through the resistance variable storage element 120 and the selector 110. On the other hand, the selector 110 returns to the first stage S1 when a programming operation of the resistance variable storage element 120 or detection of the read current is over. In addition, the selector 110 may stay at the first stage S1 while not being selected, or in a condition that the resistance variable storage element 120 at a high resistance state is subjected to a read operation.

Prior to the operation cycles respectively described above, a conductive path may be initially formed across the switching layer 116 of the selector 110 by a first fire operation, which may be performed during chip test. During the first fire operation, a voltage applied to the switching layer 116 is pulled up to a first fire voltage $V_{FF}$. Meanwhile, a current passing through the selector 110 abruptly increases, and the initial conductive path is formed through the selector 110. After the initially formed conductive path is cut off by pulling down the voltage applied across the selector 110 to the holding voltage $V_H$ from the first fire voltage, the operation cycles respectively described above can be performed. During each of these operation cycles, the conductive path may be reconstructed and then cut off.

The first fire voltage $V_{FF}$ may be greater than the threshold voltage $V_{TH}$, which is further higher than the holding voltage $V_H$. In some embodiments, the memory array 10 is integrated with logic circuits in a single device die, and the integration of the memory array 10 and the logic circuits could be easier if the first fire voltage $V_{FF}$ used for initializing the selectors 110 in the memory array 10 is reduced to be equal to or lower than a power supply voltage (i.e., $V_{DD}$) of the logic circuits. In addition, the switching layer 116 of the selector 110 may be subjected to significant electrical stress during the first fire operation. Such electrical stress may result in undesired increase of off current defined as a current passing through the selector 110 when a voltage bias applied across the selector 110 is fixed at a level lower than the threshold voltage $V_{TH}$. Further, such electrical stress may result in great variations of the threshold voltage $V_{TH}$ and the off current, including cycle-to-cycle and device-device variations.

Therefore, by lowering the first fire voltage $V_{FF}$, the integration of the memory array 10 and the logic circuits can be more easily realized. On top of that, the electrical stress resulted from the first fire operation can be reduced, such that the off current of the selector 110 can be lowered, and variations of the threshold voltage $V_{TH}$ and the off current can be effectively limited. Optimized first fire operation is provided in various embodiments of the present disclosure.

Figure 2A:
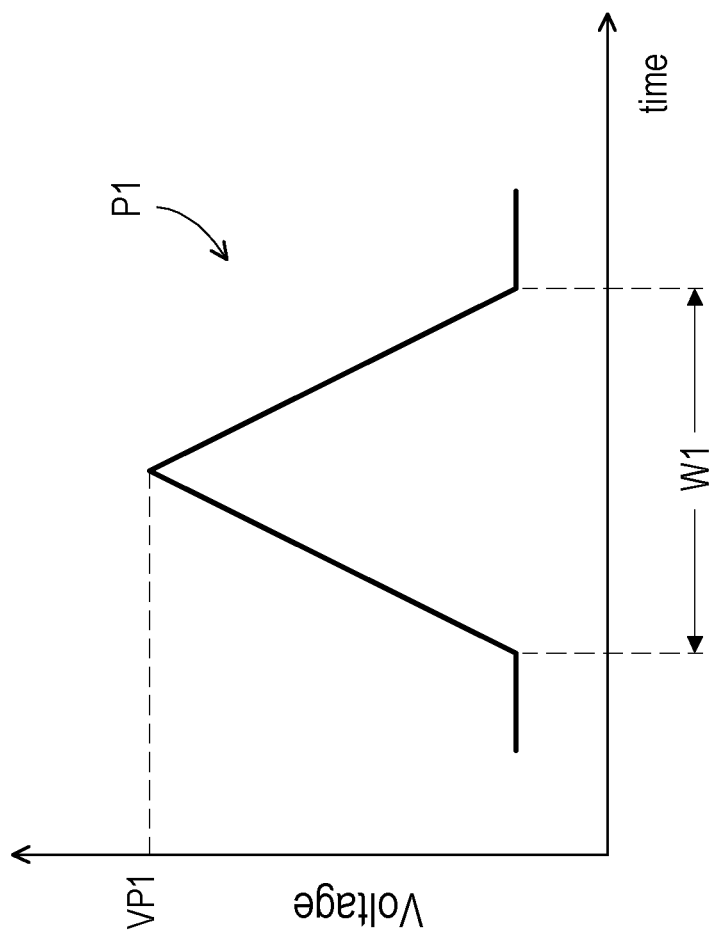
FIG. 2A is a schematic diagram illustrating a voltage pulse used in a first fire operation, according to some embodiments of the present disclosure.

FIG. 2A is a schematic diagram illustrating a voltage pulse P1 used in a first fire operation, according to some embodiments of the present disclosure.

Referring to FIG. 2A, in some embodiments, the first fire operation is performed by providing the voltage pulse P1 to the selector 110 at an elevated temperature. According to a possible mechanism, the initial conductive path of the selector 110 can be formed when provided energy get over an activation barrier of the initial conductive path. By performing the first fire operation at an elevated temperature, additional energy is provided. In other words, the energy required for overcoming the activation barrier is not solely provided by the voltage pulse P1. As a result, the first fire voltage $V_{FF}$ indicated by a peak amplitude of the voltage pulse P1 can be lowered. In addition, the voltage pulse P1 can be provided with a shorter width. According to some embodiments, a substrate (e.g., a wafer) formed with the memory array 10 is heated to a temperature ranging from about 45° C. to about 150° C. during the first fire operation.

According to some embodiments, the voltage pulse P1 is a triangular pulse. An amplitude of the voltage pulse P1 raises sufficiently during a first half of the voltage pulse P1 for ensuring formation of the initial conductive path in the selector 110, then drops down in a second half of the voltage pulse P1. In order to ensure formation of the initial conductive path, a peak amplitude VP1 of the voltage pulse P1 should be great enough for overcoming the activation barrier of the initial conductive path, and is indicative of the first fire voltage $V_{FF}$. Since additional thermal energy is provided by heating a substrate (e.g., a wafer) formed with the memory array 10 during the first fire operation, the peak amplitude VP1 of the voltage pulse P1 used in the first fire operation (which is indicative of the first fire voltage $V_{FF}$) can be lower than a peak amplitude of a voltage pulse used in a first fire operation performed at room temperature. By lowering the peak amplitude VP1 of the voltage pulse P1 (i.e., lowering the first fire voltage $V_{FF}$), integration of the memory array 10 and logic circuits with low power supply voltage can be much easier. In some embodiments, the memory array 10 is integrated with logic circuits in a single device die, and a power supply voltage of the logic circuits may range from about 1.8V to about 3V. In these embodiments, the peak amplitude VP1 of the voltage pulse P1 can be lowered to about 1.7V, while the first fire operation using the voltage pulse P1 is performed at about 125° C. According to various embodiments, the first fire operation using the voltage pulse P1 is performed at an elevated temperature ranging from about 45° C. to about 125° C., and the peak amplitude VP1 of the voltage pulse P1 may be limited to a range from about 1.8V to about 3V.

Further, in some embodiments, the voltage pulse P1 is provided as a transient pulse, which may also be referred to as an alternating current (AC) pulse. As compared to a quasi-static operation using a slowly varying signal (also referred to as a direct current (DC) operation), the voltage pulse P1 provided as a transient pulse has a much shorter width W1, such that the disclosed first fire operation is rendered more compatible with actual operating conditions of the memory cell 100. Moreover, as having a shorter pulse width as compared to a signal used in DC operation, the voltage pulse P1 as an AC pulse may result in much less electrical stress. Accordingly, the off current of the selector 110 can be lowered, and variations of the off current as well as the threshold voltage $V_{TH}$ of the selector 110 can be effectively limited. As an example, the width W1 of the voltage pulse P1 may range from about 40 nanoseconds (ns) to 20 microseconds (μs), while a width of a long pulse used in DC operation may range from about 100 milliseconds (ms) to about seconds, or greater.

FIG. 2B is a schematic diagram illustrating a first fire operation performed on a test structure 200. FIG. 2C is a diagram showing dependency of first fire voltage $V_{FF}$ with respect to process temperature of the first fire operation shown in FIG. 2B.

Referring to FIG. 2B, the test structure 200 is similar to a memory cell 100, except that the selector 110 in the test structure 200 is in serial connection with a load resistor $R_{load}$, rather than the resistance variable storage element 120. A plurality of test structures 200 are provided, and each test structure 200 is subjected to a first fire operation similar to the first fire operation according to various embodiments of the present disclosure. That is, the first fire operation performed on each test structure 200 is executed at an elevated temperature, and includes applying the voltage pulse P1.

The voltage pulse P1 is provided to a terminal of the selector 110. In addition, a terminal of the load resistor $R_{load}$ is coupled to the selector 110, whereas the other terminal of the load resistor $R_{load}$ may be coupled to a voltage source (e.g., a ground voltage). By reading a current IR passing through the load resistor $R_{load}$, switching of the selector 110 can be observed. In order to verify temperature dependency of the first fire voltage $V_{FF}$ with respect to temperature, the first fire operations are performed on the test structures 200 at various temperatures. For each temperature, a group of the test structures 200 are subjected to the first fire operation.

As shown in FIG. 2C, the first fire operations are performed on the test structures 200 at 25° C., 45° C., 65° C., 85° C., 105° C. and 125° C., and the first fire voltages $V_{FF}$ obtained by analyzing the currents IR passing through the load resistors $R_{load}$ of the test structures 200 are shown as data dots in the diagram. For each temperature, over 10 of the test structures 200 are subjected to the first fire operation. A median value of the first fire voltages $V_{FF}$ corresponding to each temperature is shown as a hollow square. According to the result, a negative dependency of the first fire voltage $V_{FF}$ with respect to the temperature is verified. That is, the first fire voltage $V_{FF}$ decreases as the temperature of the first fire operation increases. In certain cases, as the temperature of the first fire operation increases from 25° C. to 125° C., the first fire voltage $V_{FF}$ (median value) may decrease from about 2.2 V to about 1.8 V or lower.

Moreover, in order to observe dependency of the off current with respect to the width W1 of the voltage pulse $V_{FF}$, a first fire operation using the voltage pulse $V_{FF}$ with a first width W1 of 20 μs is performed on a test structures 200 at an elevated temperature or room temperature, and a first fire operation using the voltage pulse $V_{FF}$ with a second width W1 of 40 ns is performed on another test structure 200 at the same temperature. After performing these first fire operations, off currents of the selectors 110 in the test structures 200 subjected to these first fire operations are measured. A fixed voltage low enough to prevent turning on the selectors 110 is provided to these test structures 200, and the off currents of the selectors 110 can be observed by reading the currents IR. For each of these test structures 200, the off current is measured multiple times, and the results are shown in FIG. 2D.

Figure 2D:
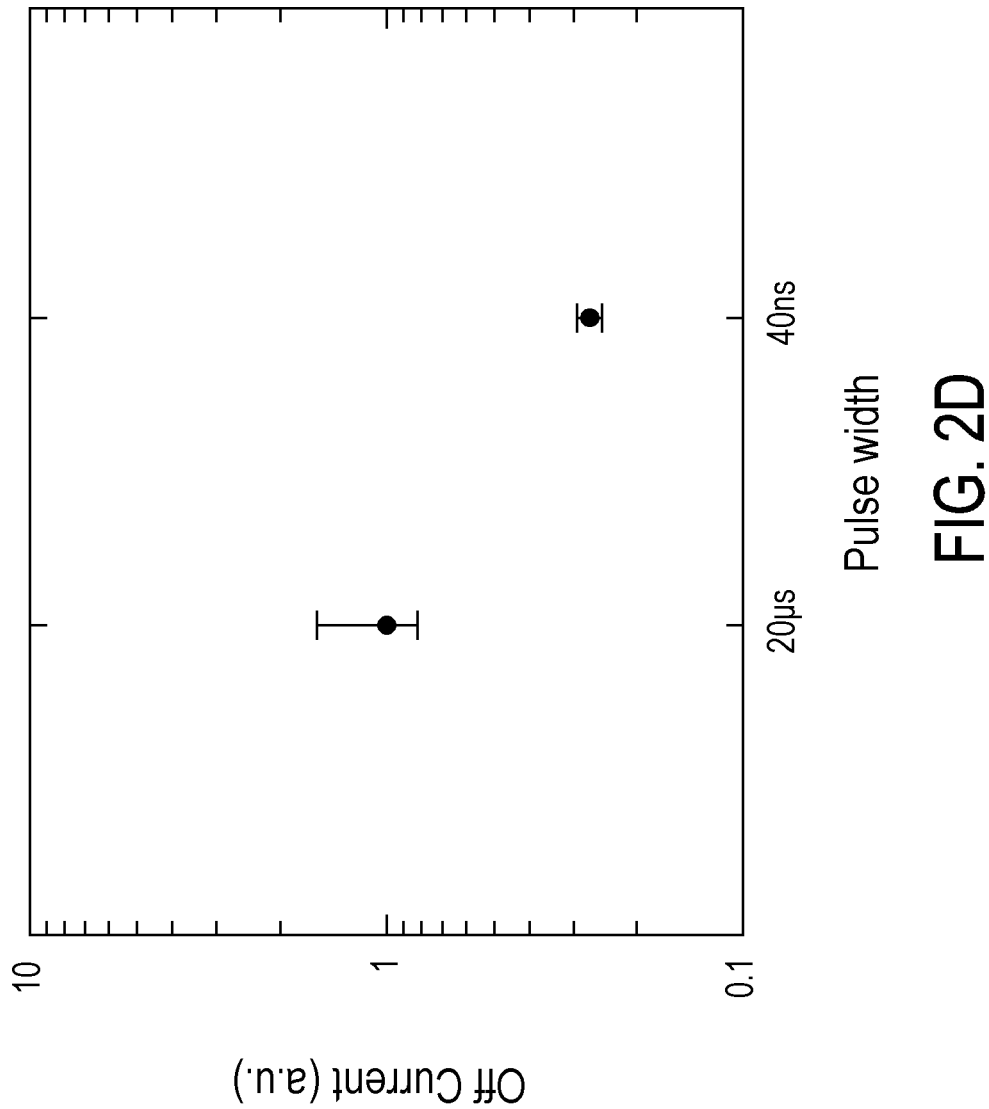
FIG. 2D is a diagram illustrating dependency of off current of the selector with respect to the width of the voltage pulse provided to the selector.

Referring to FIG. 2D, $25^{th}$ percentile to $75^{th}$ percentile of the off currents measured from the test structure 200 subjected to the first fire operation using the voltage pulse $V_{FF}$ having the width W1 of 20 μs are represented by an error bar, and a median value of these off currents is represented by a data point. Similarly, $25^{th}$ percentile to $75^{th}$ percentile of the off currents measured from the test structure 200 subjected to the first fire operation using the voltage pulse $V_{FF}$ having the width W1 of 40 ns are represented by an error bar, and a median value of these off currents is represented by a data point. As indicated by the median values, the off current of the selector 110 decreases as the voltage pulse $V_{FF}$ used in the first fire operation has a shorter width W1. Further, as indicated by the error bars, variation of the off current of the selector 110 is reduced when the voltage pulse $V_{FF}$ used in the first fire operation has a shorter width W1, and this result also implies that variation of the threshold voltage $V_{TH}$ of the selector 110 can be reduced when the width W1 of the voltage pulse $V_{FF}$ used in the first fire operation is shortened.

It should be noted that, the first fire operation according to various embodiments is described by using a triangular pulse (e.g., the voltage pulse $V_{FF}$ as shown in FIG. 2A). However, a voltage pulse with other pulse shape (e.g., a rectangular pulse) is also available, as long as a pulse width is within the described range.

Figure 3A:
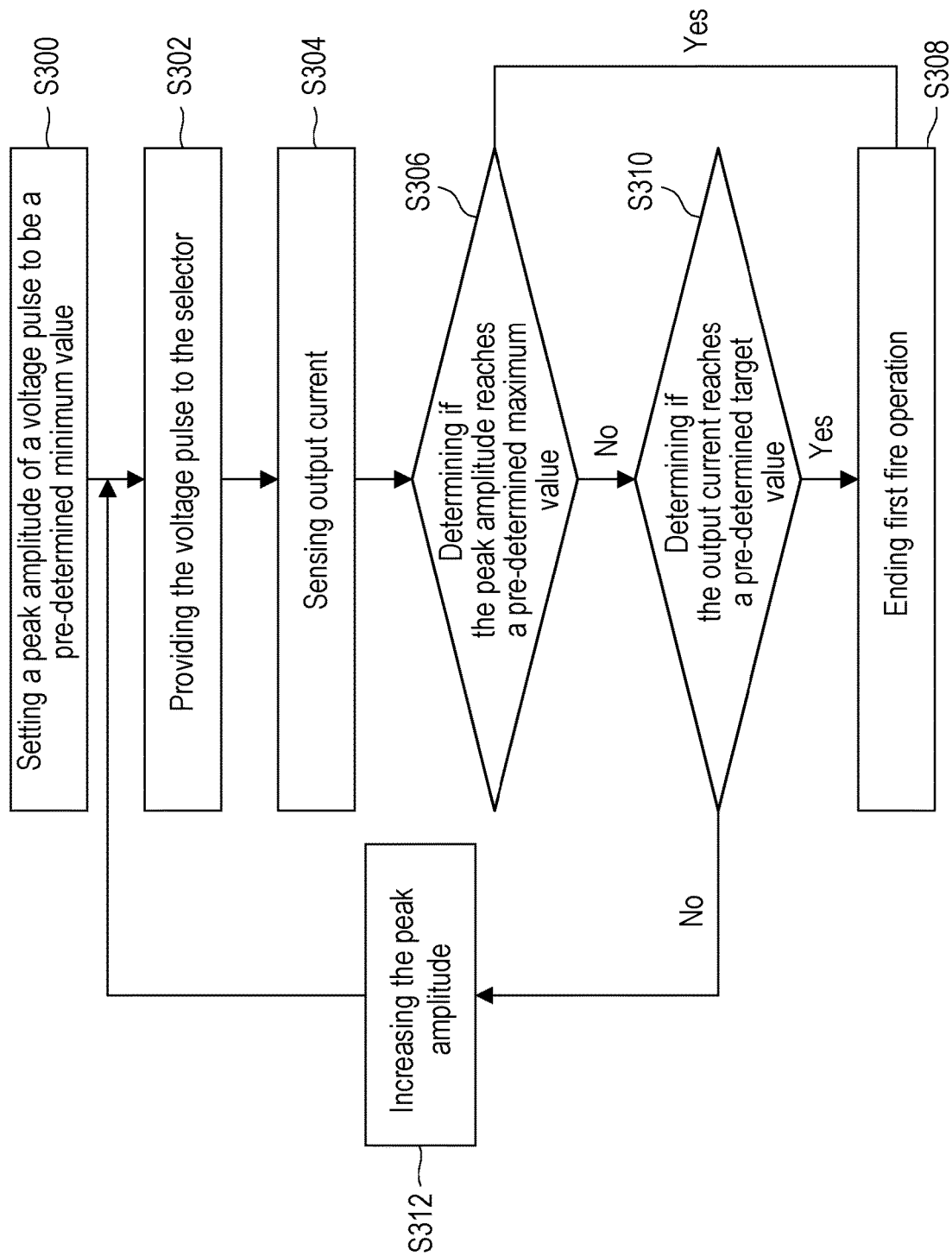
FIG. 3A is a flow diagram illustrating an adaptive first fire operation performed on a memory cell, according to some embodiments of the present disclosure.
Figure 3B:
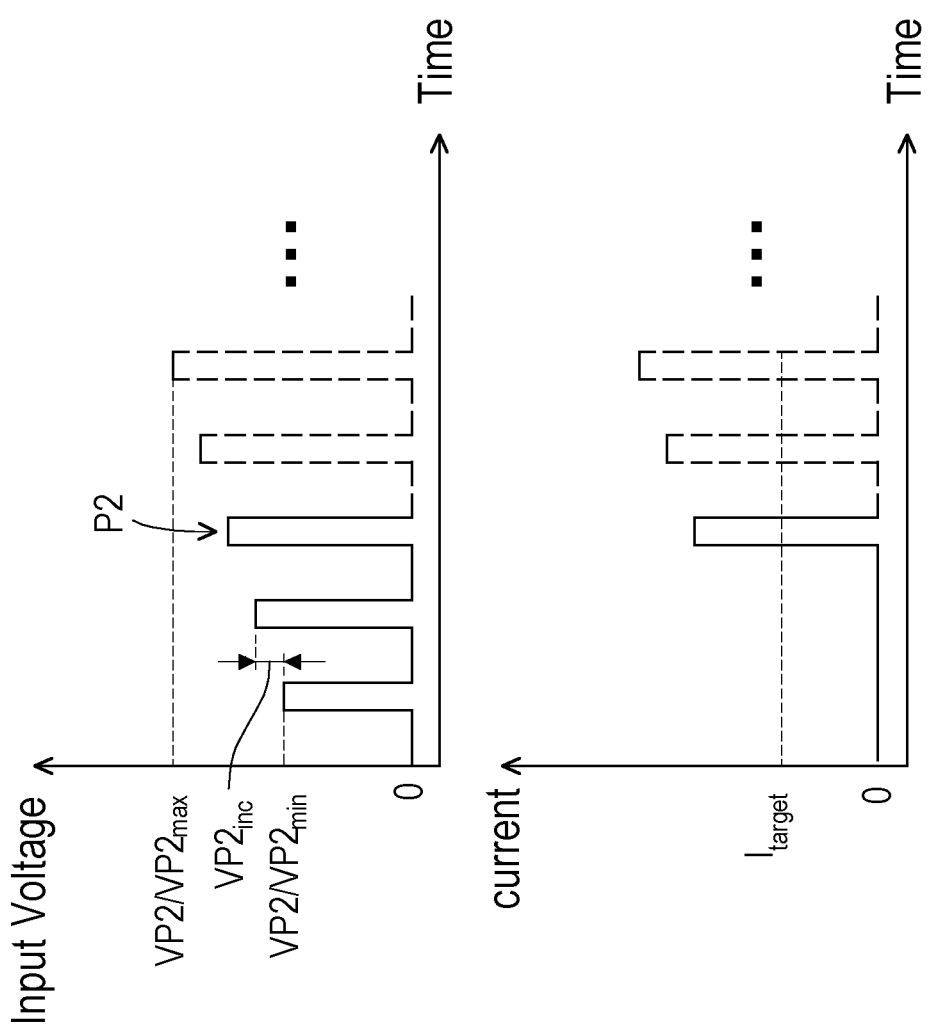
FIG. 3B illustrates input voltage pulses and resulted output current during the adaptive first fire operation as shown in FIG. 3A.

FIG. 3A is a flow diagram illustrating an adaptive first fire operation 300 performed on a memory cell 100, according to some embodiments of the present disclosure. FIG. 3B illustrates input voltage pulses P2 and resulted output current during the adaptive first fire operation as shown in FIG. 3A.

Referring to FIG. 3A and FIG. 3B, the adaptive first fire operation 300 is provided for further reducing resulted electrical stress. The adaptive first fire operation 300 is initially performed on one of the memory cell 100 at an elevated temperature (e.g., ranging from about 45° C. to about 150° C.) or room temperature, and is repeated on next memory cell 100 until all of the memory cells 100 are initialized. In each time, the adaptive first fire operation 300 may include successively providing multiple voltage pulses P2 to the selector 110. A peak amplitude VP2 of each voltage pulse P2 is lower than a peak amplitude VP2 of the next voltage pulse P2. As an example, each voltage pulse P2 may be a square pulse. However, each voltage pulse P2 may alternatively be a triangular pulse similar to the voltage pulse P1 described with reference to FIG. 2A, or a voltage pulse with any pulse shape.

The adaptive first fire operation 300 begins with an operation S300, and ends at an operation S308. A cycle including operations between the opening operation S300 and the ending operation S308 is performed at least once. At the operation S300, a peak amplitude VP2 of a first one of the voltage pulse P2 is set to be a pre-determined minimum peak amplitude $VP2_{min}$. Thereafter, at an operation S302, the voltage pulse P2 is provided to the selector 110, then an output current passing through the selector 110 is sensed during an operation S304. For instance, a sense amplifier may be used for sensing the output current.

At an operation S306, the peak amplitude VP2 is compared to a pre-determined maximum peak amplitude $VP2_{max}$. The maximum peak amplitude $VP2_{max}$ is high enough that formation of the initial conductive path in the selector 110 can be ensured, but might be greater than the actual first fire voltage $V_{FF}$ of the selector 110. If the peak amplitude VP2 reaches the maximum peak amplitude $VP2_{max}$, then the initialization of the selector 110 is considered to be completed, and is ended as indicated by an operation S308.

On the other hand, if the peak amplitude VP2 does not reach the maximum peak amplitude $VP2_{max}$, whether if the selector 110 has been initialized needs a further check. Accordingly, as indicated by an operation S310, another comparison is performed. During the operation S310, the output current is compared to a pre-determined target current $I_{target}$. The target current $I_{target}$ is set to be higher than the ground level of the output current (i.e., an off-current of the selector 110), and may be equal to or slightly greater than a current at the threshold voltage $V_{TH}$ as shown in FIG. 1D, but lower than an on-current of the selector 110 (the current at the stage S3 as shown in FIG. 1D). That is, if the output current reaches the target current $I_{target}$, then the initialization of the selector 110 is considered to be completed, and should be ended as indicated by an operation S308.

If the output current does not reach the target current $I_{target}$, it indicates that the selector 110 has not been initialized. In other words, the peak amplitude VP2 of the voltage pulse P2 to be provided in next cycle has to be increased, as indicated by an operation S312. In some embodiments, the peak amplitude VP2 of the next voltage pulse P2 is set to be increased by an increment $VP2_{inc}$. The cycle including the operations between the opening operation S300 and the ending operation S308 is repeated until the peak amplitude VP2 reaches the maximum peak amplitude $VP2_{max}$ or the output current reaches the target current $I_{target}$. As an example as shown in FIG. 3B, the output current reaches the target current $I_{target}$ in the third cycle, in which the peak amplitude VP2 is still lower than the maximum peak amplitude $VP2_{max}$. Accordingly, the first fire operation 300 is terminated at the end of the third cycle, thus the voltage pulses and the output current in the following cycles are depicted by dash lines.

By properly setting the minimum peak amplitude $VP2_{min}$ and the increment $VP2_{inc}$, the peak amplitude VP2 of the voltage pulse P2 used in the final cycle (i.e., the cycle that initialize the selector 110) can be as close to the actual first fire voltage $V_{FF}$ as possible. Therefore, the adaptive fire operation 300 can effectively limit electrical stress resulted on the selector 110.

Figure 4A:
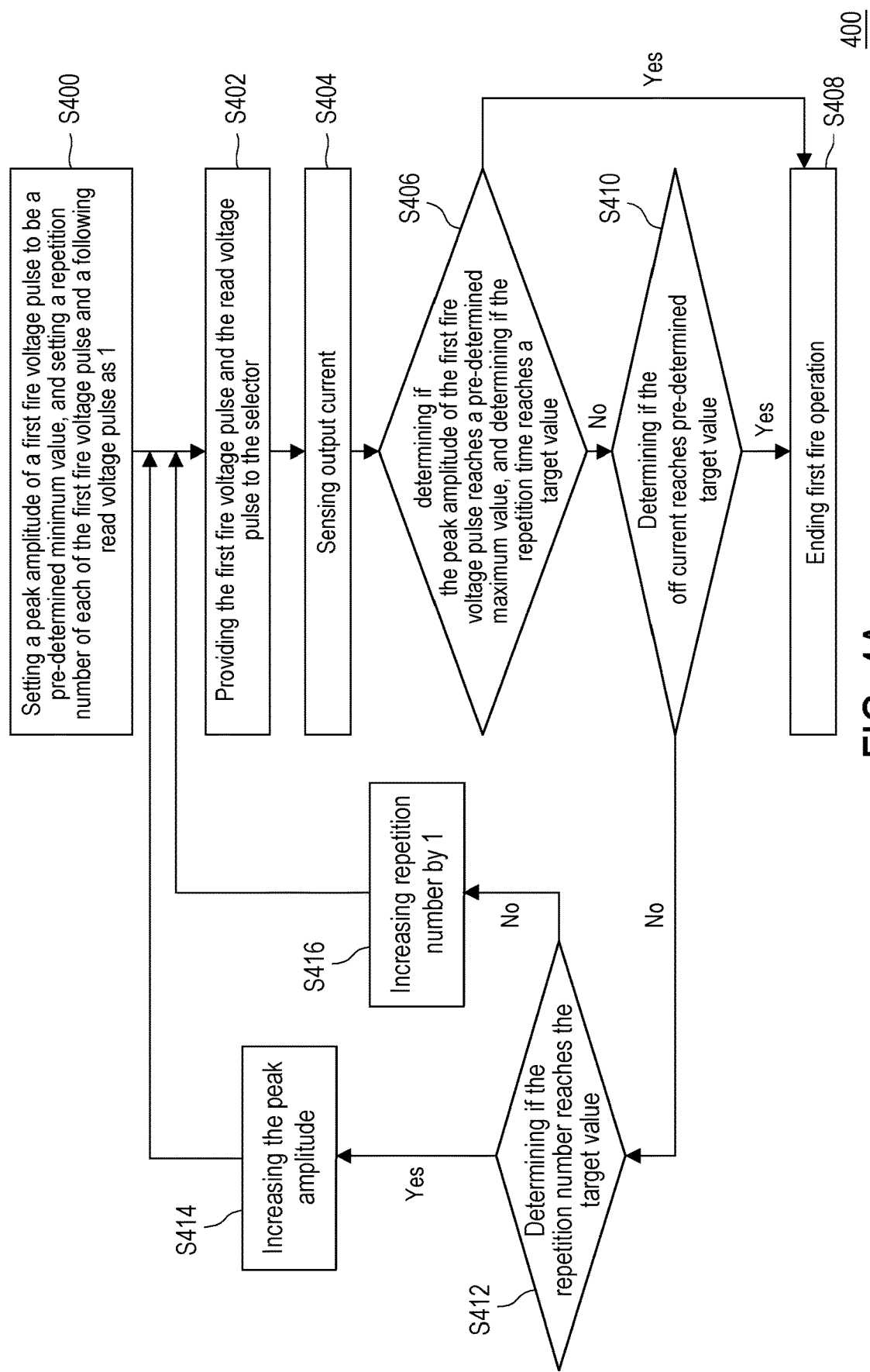
FIG. 4A is a flow diagram illustrating an adaptive first fire operation performed on a memory cell, according to some embodiments of the present disclosure.
Figure 4B:
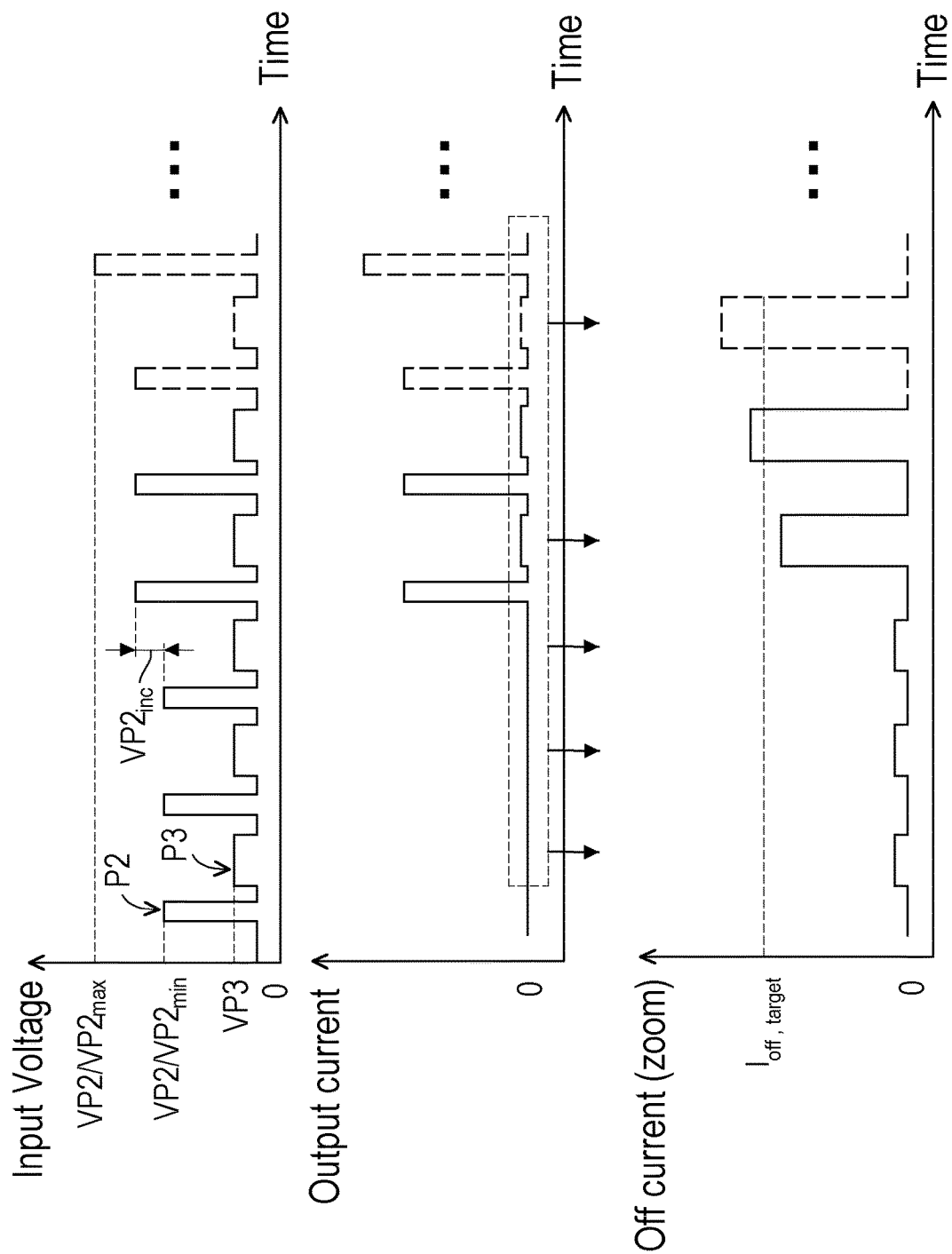
FIG. 4B illustrates input voltage pulses and resulted output current during the adaptive first fire operation as shown in FIG. 4A.

FIG. 4A is a flow diagram illustrating an adaptive first fire operation 400 performed on a memory cell 100, according to some embodiments of the present disclosure. FIG. 4B illustrates input voltage pulses P2, P3 and resulted output current during the adaptive first fire operation as shown in FIG. 4A.

Referring FIG. 4A and FIG. 4B, the first fire operation 400 is adaptive based on off current variation of the selector 110. As similar to the adaptive first fire operation 300 described with reference to FIG. 3A and FIG. 3B, the adaptive first fire operation 400 is initially performed on one of the memory cell 100 at an elevated temperature (e.g., ranging from about 45° C. to about 150° C.) or room temperature, and is repeated on next memory cell 100 until all of the memory cells 100 are initialized.

For each memory cell 100, groups of the voltage pulses P2 are successively provided. The voltage pulses P2 in each group have the same peak amplitude VP2, and the peak amplitude VP2 of the voltage pulses P2 in each group is lower than the peak amplitude VP2 of the voltage pulses P2 in a next group. Further, each voltage pulse P2 is followed by a voltage pulse P3 for reading the off current of the selector 110. The voltage pulses P3 may have identical peak amplitude VP3, which is much lower than the peak amplitude VP2 of the voltage pulses P2 (e.g., much lower than the minimum peak amplitude $VP2_{min}$ of the voltage pulses P2 in the first group), for monitoring the off current of the selector 110 when the selector 110 is in an off state (i.e., at the stage S1 as described with reference to FIG. 1D). It should be noted that, a bottommost diagram in FIG. 4B is a zoomed-in view of the off current shown in a middle diagram in FIG. 4B. In the bottommost diagram in FIG. 4B, portions of the output current in response to the voltage pulses P2 are omitted.

The adaptive first fire operation 400 begins with an operation S400, and ends at an operation S408. A cycle including operations between the opening operation S400 and the ending operation S408 is performed at least once. At the opening operation S400, a peak amplitude VP2 of a voltage pulse P2 is set to be the minimum peak amplitude $VP2_{min}$, and a repetition number of each of the voltage pulse P2 and a following voltage pulse P3 is set as 1. Thereafter, at an operation S402, the voltage pulse P2 and the following voltage pulse P3 are provided to the selector 110, and then an output current passing through the selector 110 is sensed during an operation S404.

At a subsequent operation S406, whether if the peak amplitude VP2 of the voltage pulse P2 reaches the maximum peak amplitude $VP2_{max}$ is determined, and whether if a repetition number of the voltage pulses P2, P3 reaches a pre-determined target value (e.g., 3 times) is determined. If the peak amplitude VP2 reaches the maximum peak amplitude $VP2_{max}$ and the repetition number reaches the target value, then the initialization of the selector 110 is considered to be completed, and should be ended as indicated by an operation S408. On the other hand, if the peak amplitude VP2 does not reach the maximum peak amplitude $VP2_{max}$ or the repetition number does not reach the target value, another comparison is performed at an operation S410.

During the operation S410, whether if the off current in response to the voltage pulse P3 reaches a target off current $I_{off,\,target}$ is determined. The target off current $I_{off,\,target}$ may be set to be a value equal to or slightly higher than a critical off current that is resulted from the voltage pulse P2 with the peak amplitude VP2 just high enough to initialize the selector 110. That is, the target off current $I_{off,\,target}$ may be indicative of initialization of the selector 110. If the off current reaches the target off current $I_{off,\,target}$, then the first fire operation is considered to be completed, and should be ended as indicated by the operation S408. On the other hand, if the off current is still below the target off current $I_{off,\,target}$, the first fire operation 400 goes to the operation S412.

At the operation S412, whether if the repetition number reaches the target value is determined, for deciding whether to increase the peak amplitude VP2 of the voltage pulse P2 in the next cycle. If the repetition number reaches the target value, then the peak amplitude VP2 of the voltage pulse P2 to be provided in next cycle is required to be increased, as indicated by an operation S414. In some embodiments, the peak amplitude VP2 of the next voltage pulse P2 is set to be increased by an increment $VP2_{inc}$. On the other hand, if the repetition number does not reach the target value, then the voltage pulse P2 (with the same peak amplitude VP2) and the following voltage pulse P3 are repeated once again in the next cycle. That is, the repetition number is increased by 1, as indicated by an operation S416. The next cycle may begin with the operation S402, for providing the voltage pulse P2 and the following voltage pulse P3 to the selector 110.

The cycle including the operations between the opening operation S400 and the ending operation S408 is repeated until the peak amplitude VP2 reaches the maximum peak amplitude $VP2_{max}$ or the off current reaches the target off current $I_{off,\,target}$.

As an example as shown in FIG. 4B, the off current reaches the target off current $I_{off,\,target}$ in the fifth cycle, in which the peak amplitude VP2 is still lower than the maximum peak amplitude $VP2_{max}$. Accordingly, the first fire operation 400 is terminated at the end of the fifth cycle, thus the voltage pulses and the output current in the following cycles are depicted by dash lines. Further, as shown in FIG. 4B, the output current in response to the voltage pulses P2, P3 significantly increases since the fourth cycle, which indicates that the selector 110 may be initialized during the fourth cycle.

By providing the voltage pulses P3 to the selector 110, the off current of the selector 110 can be monitored. Further, by properly adjusting the target off current $I_{off,\,target}$, the selector 110 can be initialized without being subjected to excessive electrical stress.

Figure 5A:
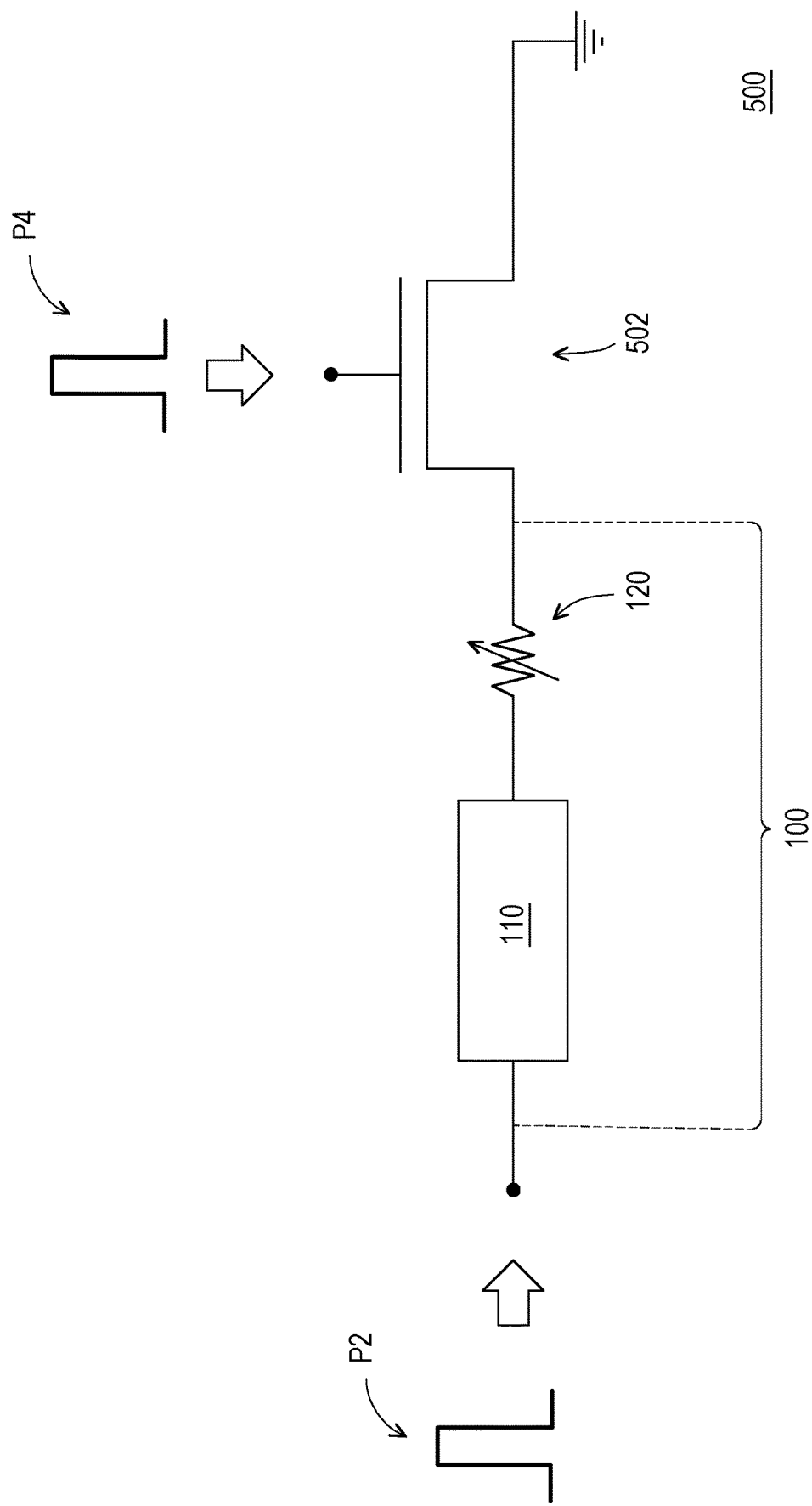
FIG. 5A is a schematic diagram illustrating an adaptive first fire operation, according to some embodiments of the present disclosure.
Figure 5B:
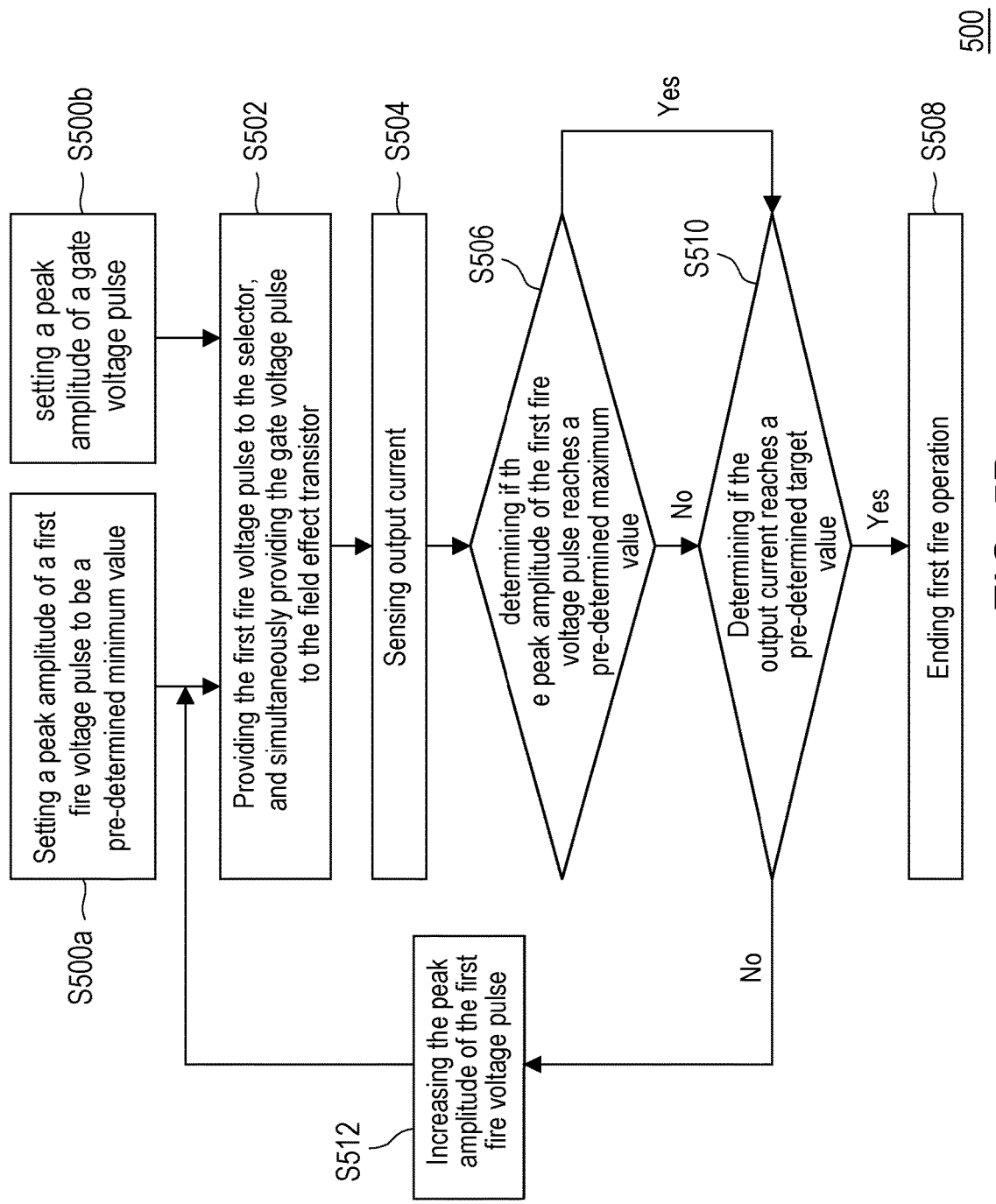
FIG. 5B is a flow diagram illustrating the adaptive first fire operation, according to some embodiments of the present disclosure.
Figure 5C:
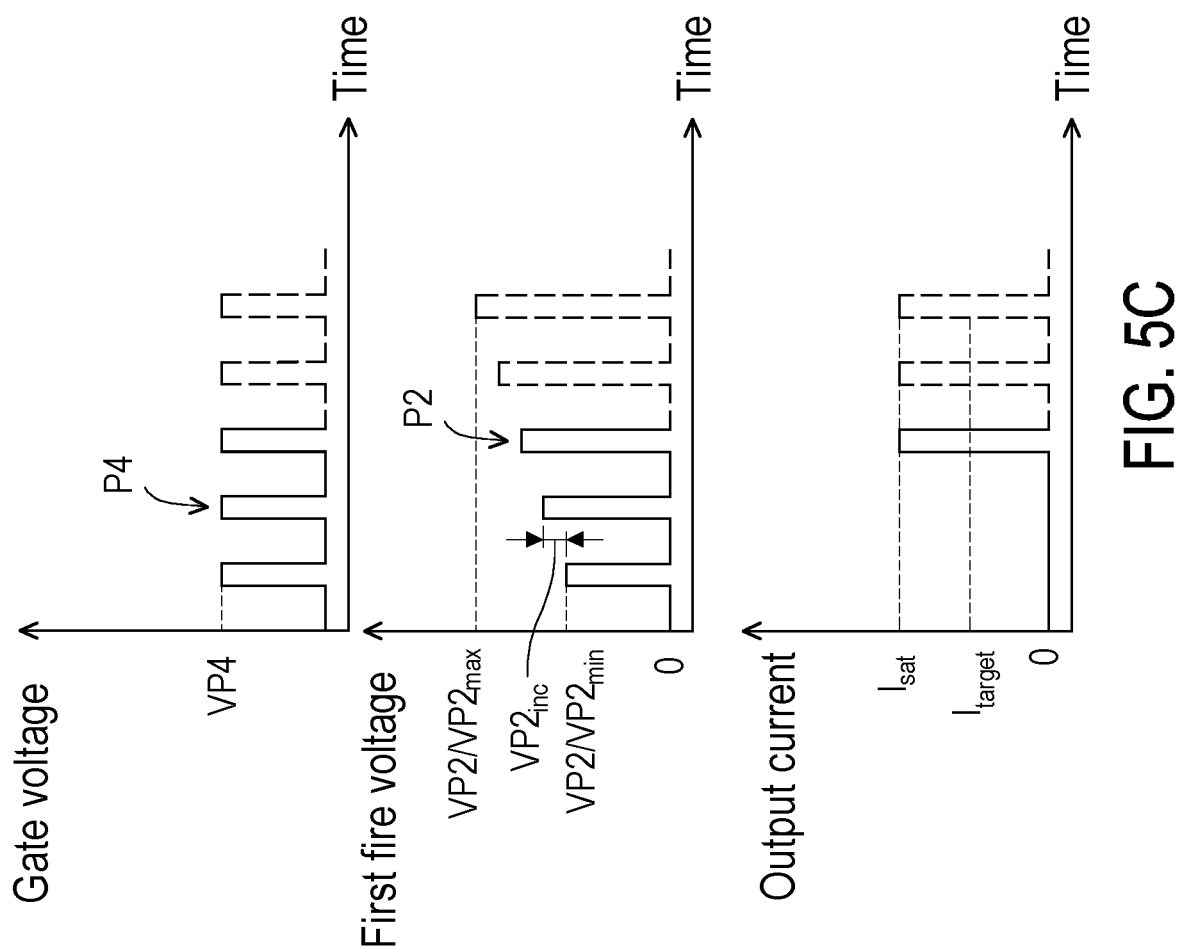
FIG. 5C illustrates input voltage pulses and resulted output current during the adaptive first fire operation 500 as shown in FIG. 5B.

FIG. 5A is a schematic diagram illustrating an adaptive first fire operation 500, according to some embodiments of the present disclosure. FIG. 5B is a flow diagram illustrating the adaptive first fire operation 500, according to some embodiments of the present disclosure. FIG. 5C illustrates input voltage pulses P2, P4 and resulted output current during the adaptive first fire operation 500 as shown in FIG. 5B.

Referring to FIG. 5A, during the adaptive first fire operation 500, each memory cell 100 is coupled to a field effect transistor 502. As similar to the adaptive first fire operation 300 described with reference to FIG. 3A and FIG. 3B, the adaptive first fire operation 500 includes providing voltage pulses P2 to the selector 110, and sensing output current passing through the selector 110. In addition, the adaptive first fire operation 500 further includes controlling the field effect transistor 502 to limit the output current. A source/drain terminal of the field effect transistor 502 is coupled to a terminal of the resistance variable storage element 120 that is not shared with the selector 110, and the other source/drain terminal of the field effect transistor 502 is coupled to a voltage source (e.g., ground voltage) through a, for example, sense amplifier (not shown). In addition, a gate terminal of the field effect transistor 502 is configured to receive the voltage pulses P4. In response to the voltage pulses P4, the field effect transistor 502 is turned on and operated in a saturation region as a result of a voltage difference between the source/drain terminals. In this way, the output current is limited to a saturation current of the field effect transistor 502. By controlling a peak amplitude VP4 of the voltage pulses P4, the saturation current and thereby the output current can be adjusted. By limiting the output current, the electrical stress resulted on the selector 110 can be further reduced. In some embodiments, each memory cell 100 is coupled to a respective field effect transistor 502. In other embodiments, multiple memory cells 100 (e.g., a row/column of memory cells 100) are coupled to a same field effect transistor 502.

The adaptive first fire operation 500 is initially performed on one of the memory cell 100 at an elevated temperature (e.g., ranging from about 45° C. to about 150° C.) or room temperature, and is repeated on next memory cell 100 until all of the memory cells 100 are initialized. In each time, the adaptive first fire operation 500 may include successively providing a plurality of the voltage pulses P2 to the selector 110. Meanwhile, a plurality of the voltage pulses P4 are provided to the field effect transistor 502.

Referring to FIG. 5A and FIG. 5B, the adaptive first fire operation 500 begins with operations S500a, S500b, and ends at an operation S508. A cycle including operations between the opening operations S500a, S500b and the ending operation S508 is performed at least once. At the operation S500a, the peak amplitude VP2 of the first voltage pulse P2 is set to be the pre-determined minimum peak amplitude $VP2_{min}$. Meanwhile, at the operation S500b, a peak amplitude of the voltage pulses P4 is set to the peak amplitude VP4, which is able to turn on the field effect transistor 502. Thereafter, at an operation S502, the voltage pulse P2 is provided to the selector 110, and one of the voltage pulses P4 is simultaneously provided to the gate terminal of the field effect transistor 502 for turning on the field effect transistor 502. Subsequently, an output current passing through the selector 110 and the field effect transistor 502 is sensed during an operation S504. For instance, a sense amplifier coupled to one of the source/drain terminals of the field effect transistor 502 may be used for sensing the output current.

At an operation S506, the peak amplitude VP2 is compared to the pre-determined maximum peak amplitude $VP2_{max}$. The maximum peak amplitude $VP2_{max}$ is set as high enough that formation of the initial conductive path in the selector 110 can be ensured, but might be greater than the actual first fire voltage $V_{FF}$ of the selector 110. If the peak amplitude VP2 reaches the maximum peak amplitude $VP2_{max}$, then the initialization of the selector 110 is considered to be completed, and is ended as indicated by an operation S508.

On the other hand, if the peak amplitude VP2 does not reach the maximum peak amplitude $VP2_{max}$, whether if the selector 110 has been initialized needs a further check. Accordingly, as indicated by an operation S510, another comparison is performed. During the operation S510, the output current is compared to the pre-determined target current $I_{target}$. The target current $I_{target}$ is set to be higher than the ground level of the output current, and may be equal to or slightly greater than a current at the threshold voltage $V_{TH}$ as shown in FIG. 1D. That is, if the output current reaches the target current $I_{target}$, then the initialization of the selector 110 is considered to be completed, and should be ended as indicated by an operation S508.

If the output current does not reach the target current $I_{target}$, it indicates that the selector 110 has not been initialized. In other words, the peak amplitude VP2 of the voltage pulse P2 to be provided in next cycle has to be increased, as indicated by an operation S512. In some embodiments, the peak amplitude VP2 of the next voltage pulse P2 is set to be increased by the increment $VP2_{inc}$. The cycle including the operations between the opening operation S500a, S500b and the ending operation S508 is repeated until the peak amplitude VP2 reaches the maximum peak amplitude $VP2_{max}$ or the output current reaches the target current $I_{target}$.

As an example as shown in FIG. 5B, the output current reaches the target current $I_{target}$ in the third cycle, in which the peak amplitude VP2 is still lower than the maximum peak amplitude $VP2_{max}$. Accordingly, the first fire operation 300 is terminated at the end of the third cycle, thus the voltage pulses and the output current in the following cycles are depicted by dash lines. In addition, the voltage pulses P4 are provided to the field effect transistor 502 as the same time that the voltage pulses P2 are provided to the selector 110, such that the field effect transistor 502 is turned on when the selector 110 receives the voltage pulses P2. Accordingly, even when the output current abruptly increases as the selector 110 is switched on, the output current can be limited to a saturation current $I_{sat}$ of the field effect transistor 502, which may be greater than the target current $I_{target}$.

By properly setting the minimum peak amplitude $VP2_{min}$ and the increment $VP2_{inc}$, the peak amplitude VP2 of the voltage pulse P2 used in the final cycle (i.e., the cycle that initialize the selector 110) can be as close to the actual first fire voltage $V_{FF}$ as possible. On top of that, the on current passing through the selector 110 can be limited by the field effect transistor 502. Therefore, the adaptive fire operation 500 can effectively limit electrical stress resulted on the selector 110.

Although not shown, the adaptive first fire operation 400 as described with reference to FIG. 4A and FIG. 4B may further include coupling the memory cell 100 to a field effect transistor for limiting the output current, as similar to the adaptive first fire operation 500 as described with reference to FIG. 5A through FIG. 5C.

Figure 6:
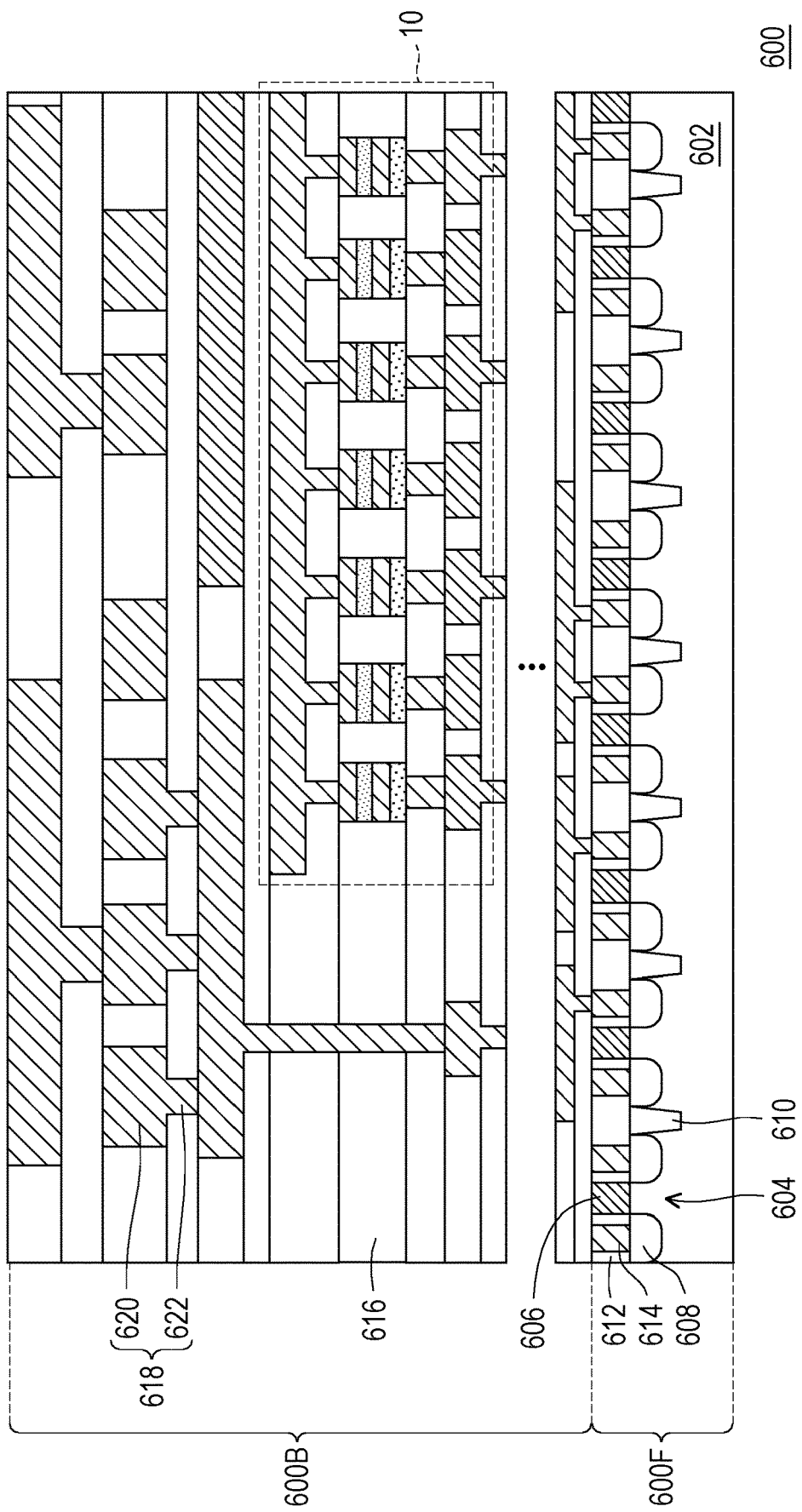
FIG. 6 is a schematic cross-sectional view illustrating a semiconductor chip with the memory array (shown in FIG. 1A) embedded therein, according to some embodiments of the present disclosure.

FIG. 6 is a schematic cross-sectional view illustrating a semiconductor chip 600 with the memory array 10 (shown in FIG. 1A) embedded therein, according to some embodiments of the present disclosure.

Referring to FIG. 6, the semiconductor chip 600 may have a front-end-of-line (FEOL) structure 600F built on a semiconductor substrate 602. The FEOL structure 600F may include transistors 604. Each of the transistors 604 may include a gate structure 606 and a pair of source/drain structures 608 at opposite sides of the gate structure 606. Further, adjacent transistors 604 may be isolated from one another by an isolation structure 610 formed in the semiconductor substrate 602. In some embodiments, the transistors 604 are planar type transistors. In these embodiments, the gate structures 606 are formed on planar portions of the semiconductor substrate 602, and the source/drain structures 608 may be formed in the semiconductor substrate 602. In alternative embodiments, the transistors 604 are fin type transistors or gate-all-around (GAA) transistors. In these alternative embodiments, the semiconductor substrate 602 may be shaped to form fin structures at its top surface, or stacks of channel structures (e.g., stacks of semiconductor nanosheets) may be formed on the semiconductor substrate 602. Each fin structure/channel structure may extend between a pair of the source/drain structures 608. In addition, the gate structures 606 may intersect and cover the fine structures or the stacks of channel structures. Moreover, the FEOL structure 600F may further include a dielectric layer 612 and contact structures 614 formed in the dielectric layer 612. The contact structures 614 penetrate through the dielectric layer 612, to establish electrical contact with the source/drain structures 608.

The memory array 10 may be embedded in a back-end-of-line (BEOL) structure 600B formed on the FEOL structure 600F. The BEOL structure 600B may include a stack of interlayer dielectric layers 616. For conciseness, only one of the interlayer dielectric layers 616 is labeled. The memory array 10 is formed in successive ones of the interlayer dielectric layers 616. Further, the BEOL structure 600B also includes conductive elements 618 spreading in the stack of interlayer dielectric layers 616, for interconnecting the transistors 604, and for out-routing the memory array 10. The conductive elements 618 may be distributed below, around and over the memory array 10, and may include conductive patterns 620 and conductive vias 622. Each conductive pattern 620 laterally extends in one of the interlayer dielectric layers 616. In addition, each conductive via 622 vertically extends through one or more of the interlayer dielectric layers 616 to establish electrical contact with one or more of the conductive patterns 620, or to establish electrical contact with one of the signal lines in the memory array 10 (i.e., one of the first signal lines SL1 or one of the second signal lines SL2). The memory array 10 may be routed to some of the transistors 604 in the FEOL structure 600F through some of the conductive elements 618, and can be driven by a driving circuit including these transistors 604.

Although the conductive elements 618 below the memory array 10 are depicted as being connected to the conductive elements 618 above the memory array 10 through a long conductive via 622 penetrating through multiple interlayer dielectric layers 616, such long conductive via 622 may be alternatively replaced by a combination of short conductive vias 622 and some conductive patterns 620. The present disclosure is not limited to the arrangement of the conductive elements 618. Further, although not shown, passivation layer(s) and electrical connectors as chip inputs/outputs (I/Os) may be formed on the BEOL structure 600B.

Figure 7:
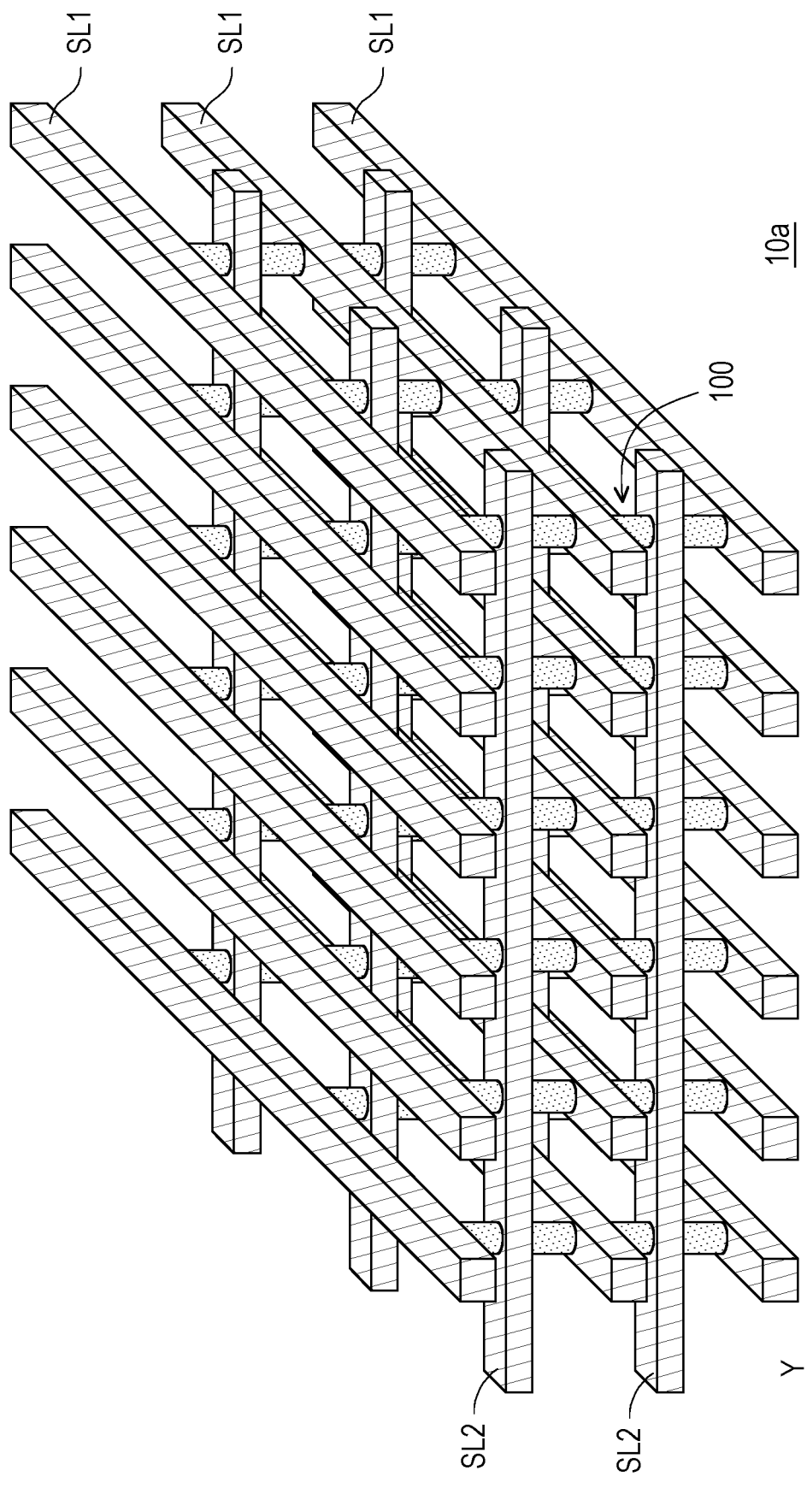
FIG. 7 is a schematic three-dimensional view illustrating a memory array, according to some embodiments of the present disclosure.

FIG. 7 is a schematic three-dimensional view illustrating a memory array 10a, according to some embodiments of the present disclosure.

The memory array 10 as shown in FIG. 1A includes the memory cells 100 arranged at a single horizontal level. On the other hand, the memory array 10a as shown in FIG. 7 has multiple horizontal levels. As shown in FIG. 7, layers of the memory cells 100 are stacked along a vertical direction. In addition, each layer of the memory cells 100 are coupled to vertically separated layers of signal lines (i.e., a layer of first signal lines SL1 and a layer of second signal lines SL2). Layers of the first signal lines SL1 and layers of the second signal lines SL2 may be alternatively arranged along a vertical direction. Accordingly, the memory cells 100 in some layers are coupled to underlying first signal lines SL1 and overlying second signal lines SL2, while the memory cells 100 in other layers are coupled to underlying second signal lines SL2 and overlying first signal lines SL1. In addition, vertically adjacent layers of the memory cells 100 may share the layer of signal lines extending in between. For instance, the bottommost layer of the memory cells 100 and the second bottommost layer of the memory cells 100 may share a layer of the second signal lines SL2 in between.

As being deployed along the vertical direction, the memory array 10a is no longer limited to two-dimensional design, and storage density can be significantly increased without increasing a footprint area of the memory array 10a. Each horizontal level of the memory array 10a may be defined by a layer of the memory cells 100 and the layers of the first and second signal lines SL1, SL2 connected thereto. Although the memory array 10a is depicted as having four horizontal levels, those skilled in the art may adjust an amount of the horizontal levels of the memory array 10a. For instance, the memory cell 10a may have two to ten horizontal levels. Further, as similar to the memory array 10 described with reference to FIG. 6, the memory array 10a shown in FIG. 7 may be embedded in a BEOL structure of a semiconductor chip as well.

Figure 8A:
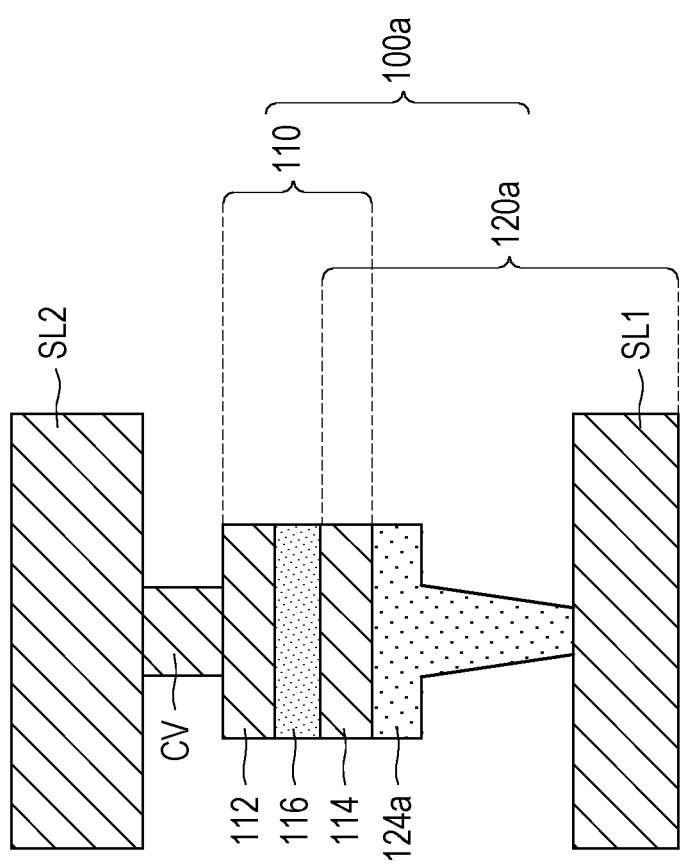
FIG. 8A is a cross-sectional view schematically illustrating a memory cell, according to some embodiments of the present disclosure.

FIG. 8A is a cross-sectional view schematically illustrating a memory cell 100a, according to some embodiments of the present disclosure. The memory cell 100a is similar to the memory cell 100 as described with reference to FIG. 1B. Therefore, only differences between the memory cells 100, 100a will be described. The same or the like parts between the memory cells 100, 100a would not be repeated again.

Referring to FIG. 8A, a resistance variable storage element 120a in a memory cell 100a may use one of the signal lines SL1, SL2 coupled to the memory cell 100a as a bottom terminal, while the electrode 114 may be functioned as a top terminal of the resistance variable storage element 120a, which is shared with the overlying selector 110. In addition, a storage layer 124a lying below the electrode 114 may further extend to the signal line as the bottom terminal of the resistance variable element 120a. For instance, as shown in FIG. 8A, the first signal line SL1 is functioned as the bottom terminal of the resistance variable storage element 120a, while the electrode 114 is functioned as the top terminal of the resistance variable storage element 120a. In addition, the storage layer 124a may have a horizontal portion lying below the electrode 114, and have a vertical portion extending from the horizontal portion to the first signal line SL1. Although not shown, the resistance variable storage element 120a in another memory cell 100a may use a second signal line SL2 as a bottom terminal, and the electrode 114 may be functioned as a top terminal of this memory cell 100a. In addition, the storage layer 124a may extend to the second signal line SL2 along a vertical direction.

Further, as similar to the memory cell 100 as described with reference to FIG. 1A and FIG. 7, a plurality of the memory cells 100a may be arranged as a two-dimensional memory array or a three-dimensional memory array. Moreover, the two-dimensional memory array or the three-dimensional memory array may be embedded in a BEOL structure of a semiconductor chip, as described with reference to FIG. 6.

Figure 8B:
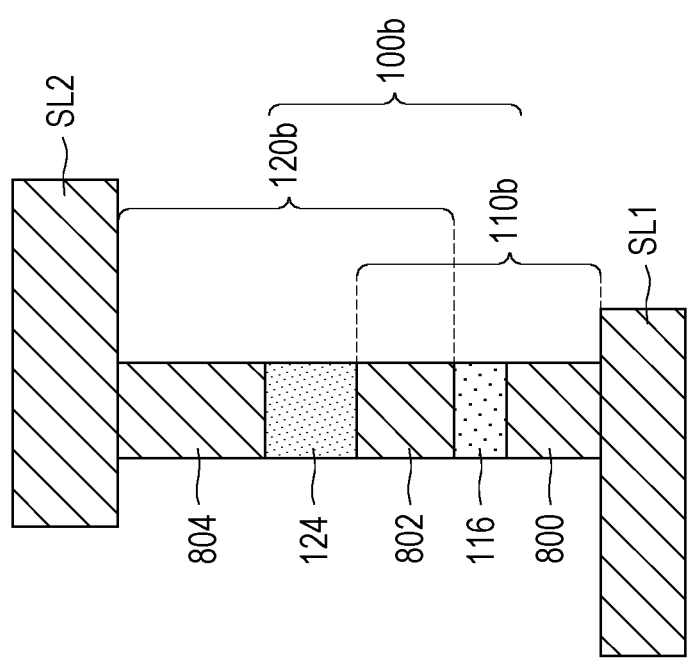
FIG. 8B is a cross-sectional view schematically illustrating a memory cell, according to some embodiments of the present disclosure.

FIG. 8B is a cross-sectional view schematically illustrating a memory cell 100b, according to some embodiments of the present disclosure. The memory cell 100b is similar to the memory cell 100 as described with reference to FIG. 1B. Therefore, only differences between the memory cells 100, 100b will be described. The same or the like parts between the memory cells 100, 100b would not be repeated again.

Referring to FIG. 8B, a resistance variable storage element 120b is stacked on a selector 110b in a memory cell 100b. Electrodes 800, 802 at opposite sides of the switching layer 116 are functioned as bottom and top terminals of the selector 110b, respectively. The electrode 800 lying below the switching layer 116 and functioned as the bottom terminal of the selector 110b may extend to the signal line extending below the memory cell 100b (e.g., a first signal line SL1). On the other hand, the electrode 802 disposed on the switching layer 116 and functioned as the top terminal of the selector 110b may be shared with the resistance variable storage element 120b. In addition to the electrode 802 lying below the storage layer 124 and functioned as a bottom terminal of the resistance variable storage element 120, the resistance variable storage element 120b may include an electrode 804 located on the storage layer 124 and functioned as its top terminal. The electrode 804 may extend from a top side of the storage layer 124 to the signal line extending on the memory cell 100b (e.g., a second signal line SL2). In some embodiments, the memory cell 100b is formed in a pillar shape. In these embodiments, sidewalls of the electrodes 800, 802, 804, the switching layer 116 and the storage layer 124 may be substantially coplanar with one another. In addition, a sidewall of such pillar structure is substantially flat from a top end of the pillar structure to a bottom end of the pillar structure. Further, the electrodes 800, 802, 804 may be similar to the electrodes 112, 114, 122 in terms of material candidates.

Further, as similar to the memory cell 100 as described with reference to FIG. 1A and FIG. 7, a plurality of the memory cells 100b may be arranged as a two-dimensional memory array or a three-dimensional memory array. Moreover, the two-dimensional memory array or the three-dimensional memory array may be embedded in a BEOL structure of a semiconductor chip, as described with reference to FIG. 6.

As above, improved first fire operations used for an OTS selector are provided according to various embodiments. In some embodiments, a first fire operation using an AC pulse is performed at an elevated temperature. In these embodiments, additional energy may be provided for overcoming the activation barrier for forming the initial conductive path in the OTS selector, such that the peak amplitude of the voltage pulse used in the first fire operation (which is indicative of a first fire voltage of the OTS selector) can be lowered. As a result, the OTS selector used in an embedded memory can be more compatible with logic circuits. On top of that, since the voltage pulse is provided as an AC pulse with extremely short width, electrical stress resulted on the OTS selector can be further reduced, such that off current variation of the OTS selector can be effectively limited. In other embodiments, the first fire operation is adaptive, that a series of voltage pulse with incremental peak amplitudes are successively provided to the OTS selector, and the first fire operation is determined to be ended when the input voltage provided to the OTS selector just sufficient for overcoming the activation barrier. In these embodiments, electrical stress resulted on the OTS selector and thus the off current variation of the OTS selector resulted from the first fire operation can be more precisely controlled.

In an aspect of the present disclosure, a first fire operation for an OTS selector is provided. The first fire operation comprises: setting a peak amplitude of a voltage pulse; and performing at least one cycle, comprising: providing the voltage pulse to the OTS selector; sensing an output current passing through the OTS selector in response to the received voltage pulse; comparing a peak amplitude of the voltage pulse with a maximum peak amplitude ensuring initialization of the OTS selector; ending the first fire operation if the peak amplitude reaches the maximum peak amplitude; comparing the output current with a target current indicative of initialization of the OTS selector if the peak amplitude is lower than the maximum peak amplitude; ending the first fire operation if the output current reaches the target current; and setting another voltage pulse with a greater peak amplitude if the output current is lower than the target current.

In another aspect of the present disclosure, a first fire operation for an OTS selector is provided. The first fire operation comprises: setting a repetition number of a first fire voltage pulse and a read voltage pulse as one; and performing at least two cycles, each comprising: sequentially providing the first fire voltage pulse and the read voltage pulse to the OTS selector; sensing an output current passing through the OTS selector in response to the first fire voltage pulse and the read voltage pulse; comparing a peak amplitude of the voltage pulse with a maximum peak amplitude ensuring initialization of the OTS selector, and comparing the repetition number of the first fire voltage pulse and the read voltage pulse with a target repetition number; ending the first fire operation if the peak amplitude reaches the maximum peak amplitude and the repetition number reaches the target repetition number; comparing the output current in response to the read voltage pulse with a target off current if the peak amplitude is lower than the maximum peak amplitude or the repetition number is lower than the target repetition number; ending the first fire operation if the output current in response to the read voltage pulse reaches the target off current; comparing the repetition number with the target repetition number if the output current in response to the read voltage pulse is lower than the target off current; setting a next first fire voltage pulse with a greater peak amplitude if the repetition number reaches the target repetition number; and increasing a repetition number of the next first fire voltage pulse and a following read voltage pulse by one.

In yet another aspect of the present disclosure, a first fire operation for an OTS selector is provided. The OTS selector is coupled to a transistor. The first fire operation comprises: setting a peak amplitude of a first fire voltage pulse and a peak amplitude of a gate voltage pulse; and performing at least one cycle, comprising: providing the first fire voltage pulse to the OTS selector and providing the gate voltage pulse to the transistor for turning on the transistor; sensing an output current passing through the OTS selector in response to the first fire voltage pulse; comparing a peak amplitude of the first fire voltage pulse with a maximum peak amplitude ensuring initialization of the OTS selector; ending the first fire operation if the peak amplitude reaches the maximum peak amplitude; comparing the output current with a target current indicative of initialization of the OTS selector if the peak amplitude is lower than the maximum peak amplitude; ending the first fire operation if the output current reaches the target current; and setting another first fire voltage pulse with a greater peak amplitude if the output current is lower than the target current.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A first fire operation for an ovonic threshold switch (OTS) selector, comprising:
   setting a peak amplitude of a voltage pulse; and
   performing at least one cycle, comprising:
     providing the voltage pulse to the OTS selector;
     sensing an output current passing through the OTS selector in response to the received voltage pulse;
     comparing a peak amplitude of the voltage pulse with a maximum peak amplitude ensuring initialization of the OTS selector;
     ending the first fire operation if the peak amplitude reaches the maximum peak amplitude;
     comparing the output current with a target current indicative of initialization of the OTS selector if the peak amplitude is lower than the maximum peak amplitude;
     ending the first fire operation if the output current reaches the target current; and
     setting another voltage pulse with a greater peak amplitude if the output current is lower than the target current.

2. The first fire operation for the OTS selector according to claim 1, wherein a pulse width of each voltage pulse ranges from 40 nanoseconds to 20 microseconds.

3. The first fire operation for the OTS selector according to claim 1, wherein the first fire operation is performed at an elevated temperature.

4. The first fire operation for the OTS selector according to claim 3, wherein the elevated temperature ranges from about 45° C. to about 150° C.

5. The first fire operation for the OTS selector according to claim 1, wherein the first fire operation is performed at a room temperature.

6. The first fire operation for the OTS selector according to claim 1, wherein the target current is lower than an on-current of the OTS selector, and greater than an off-current of the OTS selector.

7. The first fire operation for the OTS selector according to claim 1, wherein the OTS selector is coupled to a resistance variable storage element in a memory cell of a memory array.

8. The first fire operation for the OTS selector according to claim 7, wherein the memory array is disposed over a logic circuit in a semiconductor chip.

9. A first fire operation for an OTS selector, comprising:
   setting a repetition number of a first fire voltage pulse and a read voltage pulse as one; and performing at least two cycles, each comprising:
sequentially providing the first fire voltage pulse and the read voltage pulse to the OTS selector;
sensing an output current passing through the OTS selector in response to the first fire voltage pulse and the read voltage pulse;
comparing a peak amplitude of the voltage pulse with a maximum peak amplitude ensuring initialization of the OTS selector, and comparing the repetition number of the first fire voltage pulse and the read voltage pulse with a target repetition number;
ending the first fire operation if the peak amplitude reaches the maximum peak amplitude and the repetition number reaches the target repetition number;
comparing the output current in response to the read voltage pulse with a target off current if the peak amplitude is lower than the maximum peak amplitude or the repetition number is lower than the target repetition number;
ending the first fire operation if the output current in response to the read voltage pulse reaches the target off current;
comparing the repetition number with the target repetition number if the output current in response to the read voltage pulse is lower than the target off current;
setting a next first fire voltage pulse with a greater peak amplitude if the repetition number reaches the target repetition number; and
increasing a repetition number of the next first fire voltage pulse and a following read voltage pulse by one.

10. The first fire operation for the OTS selector according to claim 9, wherein the read voltage pulses in the cycles have an identical peak amplitude.

11. The first fire operation for the OTS selector according to claim 9, wherein a peak amplitude of the read voltage pulses is lower than the peak amplitude of each first fire voltage pulse.

12. The first fire operation for the OTS selector according to claim 9, wherein the target off current is indicative of initialization of the OTS selector.

13. The first fire operation for the OTS selector according to claim 9, wherein the target repetition number is greater than one.

14. The first fire operation for the OTS selector according to claim 1, wherein a pulse width of each first fire voltage pulse ranges from 40 nanoseconds to 20 microseconds.

15. The first fire operation for the OTS selector according to claim 9, wherein the first fire operation is performed at an elevated temperature.

16. The first fire operation for the OTS selector according to claim 9, wherein the first fire operation is performed at a room temperature.

17. A first fire operation for an OTS selector, wherein the OTS selector is coupled to a transistor, and the first fire operation comprises:
setting a peak amplitude of a first fire voltage pulse and a peak amplitude of a gate voltage pulse; and
performing at least one cycle, comprising:
providing the first fire voltage pulse to the OTS selector and providing the gate voltage pulse to the transistor for turning on the transistor;
sensing an output current passing through the OTS selector in response to the first fire voltage pulse;
comparing a peak amplitude of the first fire voltage pulse with a maximum peak amplitude ensuring initialization of the OTS selector;
ending the first fire operation if the peak amplitude reaches the maximum peak amplitude;
comparing the output current with a target current indicative of initialization of the OTS selector if the peak amplitude is lower than the maximum peak amplitude;
ending the first fire operation if the output current reaches the target current; and
setting another first fire voltage pulse with a greater peak amplitude if the output current is lower than the target current.

18. The first fire operation for the OTS selector according to claim 17, wherein the output current is limited to be equal to or lower than a saturation current of the transistor.

19. The first fire operation for the OTS selector according to claim 17, wherein each gate voltage pulse is provided to a gate terminal of the transistor, and a source/drain terminal of the transistor is coupled to the OTS selector.

20. The first fire operation for the OTS selector according to claim 17, wherein the first fire voltage and the gate voltage pulse in each cycle are simultaneously provided to the OTS selector and the transistor.

\* \* \* \* \*